(12) United States Patent
Kai et al.

(10) Patent No.: US 11,043,455 B2
(45) Date of Patent: Jun. 22, 2021

(54) THREE-DIMENSIONAL MEMORY DEVICE INCLUDING SELF-ALIGNED DIELECTRIC ISOLATION REGIONS FOR CONNECTION VIA STRUCTURES AND METHOD OF MAKING THE SAME

(71) Applicant: SANDISK TECHNOLOGIES LLC, Addison, TX (US)

(72) Inventors: James Kai, Santa Clara, CA (US); Johann Alsmeier, San Jose, CA (US); Jixin Yu, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 48 days.

(21) Appl. No.: 16/519,260

(22) Filed: Jul. 23, 2019

(65) Prior Publication Data
US 2021/0028111 A1    Jan. 28, 2021

(51) Int. Cl.
| | |
|---|---|
| *H01L 23/535* | (2006.01) |
| *H01L 27/11556* | (2017.01) |
| *H01L 21/768* | (2006.01) |
| *H01L 23/522* | (2006.01) |
| *H01L 27/11582* | (2017.01) |

(52) U.S. Cl.
CPC ...... *H01L 23/535* (2013.01); *H01L 21/76877* (2013.01); *H01L 23/5226* (2013.01); *H01L 27/11556* (2013.01); *H01L 27/11582* (2013.01)

(58) Field of Classification Search
CPC .................. H01L 27/11556; H01L 27/11582
See application file for complete search history.

(56) References Cited

U.S. PATENT DOCUMENTS

| | | |
|---|---|---|
| 9,455,267 B2 | 9/2016 | Zhang et al. |
| 9,806,093 B2 | 10/2017 | Toyama et al. |
| 9,818,693 B2 | 11/2017 | Toyama et al. |
| (Continued) | | |

OTHER PUBLICATIONS

U.S. Appl. No. 16/142,447, filed Sep. 26, 2018, SanDisk Technologies LLC.

(Continued)

*Primary Examiner* — Lex H Malsawma
*Assistant Examiner* — Gardner W. S. Swan
(74) *Attorney, Agent, or Firm* — The Marbury Law Group PLLC

(57) ABSTRACT

A vertically alternating sequence of continuous insulating layers and continuous sacrificial material layers is formed over a substrate. Memory stack structures are formed through the vertically alternating sequence. The vertically alternating sequence is divided into alternating stacks of insulating layers and sacrificial material layers by forming backside trenches therethrough. Each neighboring pair of alternating stacks is laterally spaced apart from each other by a respective backside trench. The sacrificial material layers are replaced with multipart layers. Each multipart layer includes a respective electrically conductive layer that laterally extends continuously between a respective neighboring pair of backside trenches and at least one dielectric material plate that is a remaining portion of a sacrificial material layer, is laterally enclosed by the respective electrically conductive layer, and is laterally spaced from a most proximal one of the backside trenches by a uniform lateral offset distance.

12 Claims, 34 Drawing Sheets

(56) References Cited

U.S. PATENT DOCUMENTS

| | | | |
|---|---|---|---|
| 9,818,759 | B2 | 11/2017 | Toyama et al. |
| 9,917,093 | B2 | 3/2018 | Chu et al. |
| 9,941,299 | B1 | 4/2018 | Chen et al. |
| 10,038,006 | B2 | 7/2018 | Furihata et al. |
| 10,103,161 | B2 | 10/2018 | Ito et al. |
| 10,115,632 | B1 | 10/2018 | Masamori et al. |
| 10,249,640 | B2 | 4/2019 | Yu et al. |
| 10,269,620 | B2 | 4/2019 | Yu et al. |
| 2014/0027835 | A1 | 1/2014 | Tanaka |
| 2014/0070300 | A1* | 3/2014 | Jang ............... H01L 27/11565 257/324 |
| 2016/0027730 | A1* | 1/2016 | Lee ............... H01L 21/76816 257/774 |
| 2016/0071876 | A1* | 3/2016 | Mizuno ............ H01L 27/11582 365/185.17 |
| 2016/0086969 | A1* | 3/2016 | Zhang ............. H01L 21/02365 257/314 |
| 2017/0179153 | A1 | 6/2017 | Ogawa et al. |
| 2017/0287833 | A1 | 10/2017 | Thimmegowda et al. |
| 2017/0358593 | A1* | 12/2017 | Yu .................. H01L 27/11582 |
| 2019/0198524 | A1 | 6/2019 | Fujiki et al. |
| 2020/0105783 | A1* | 4/2020 | Baek ............... H01L 21/76898 |
| 2020/0194453 | A1* | 6/2020 | Lim ............... H01L 27/11582 |

OTHER PUBLICATIONS

U.S. Appl. No. 16/362,988, filed Mar. 25, 2019, SanDisk Technologies LLC.
U.S. Appl. No. 16/423,500, filed May 28, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/366,245, filed May 27, 2019, SanDisk Technologies LLC.
U.S. Appl. No. 16/366,330, filed May 27, 2019, SanDisk Technologies LLC.
U.S. Appl. No. 16/444,125, filed Jun. 18, 2019, SanDisk Technologies LLC.
U.S. Appl. No. 16/444,186, filed Jun. 18, 2019, SanDisk Technologies LLC.
Endoh, T. et al., "Novel Ultra High Density Flash Memory with A Stacked-Surrounding Gate Transistor (S-GT) Structured Cell," IEDM Proc., pp. 33-36, (2001).
Notification of Transmittal of the International Search Report and Written Opinion of the International Search Authority for International Patent Application No. PCT/US2020/023863, dated Jul. 27, 2020, 11 pages.

* cited by examiner

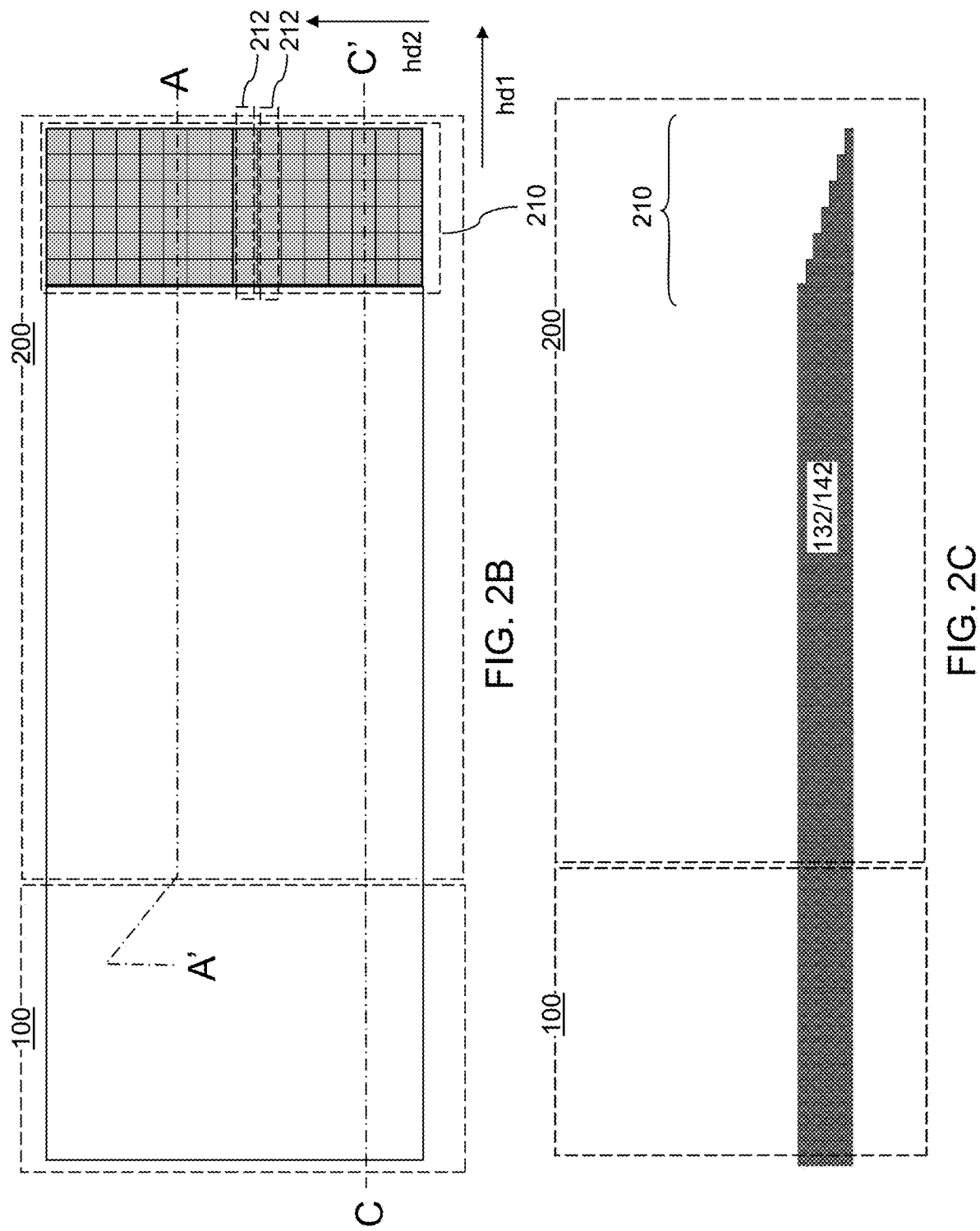

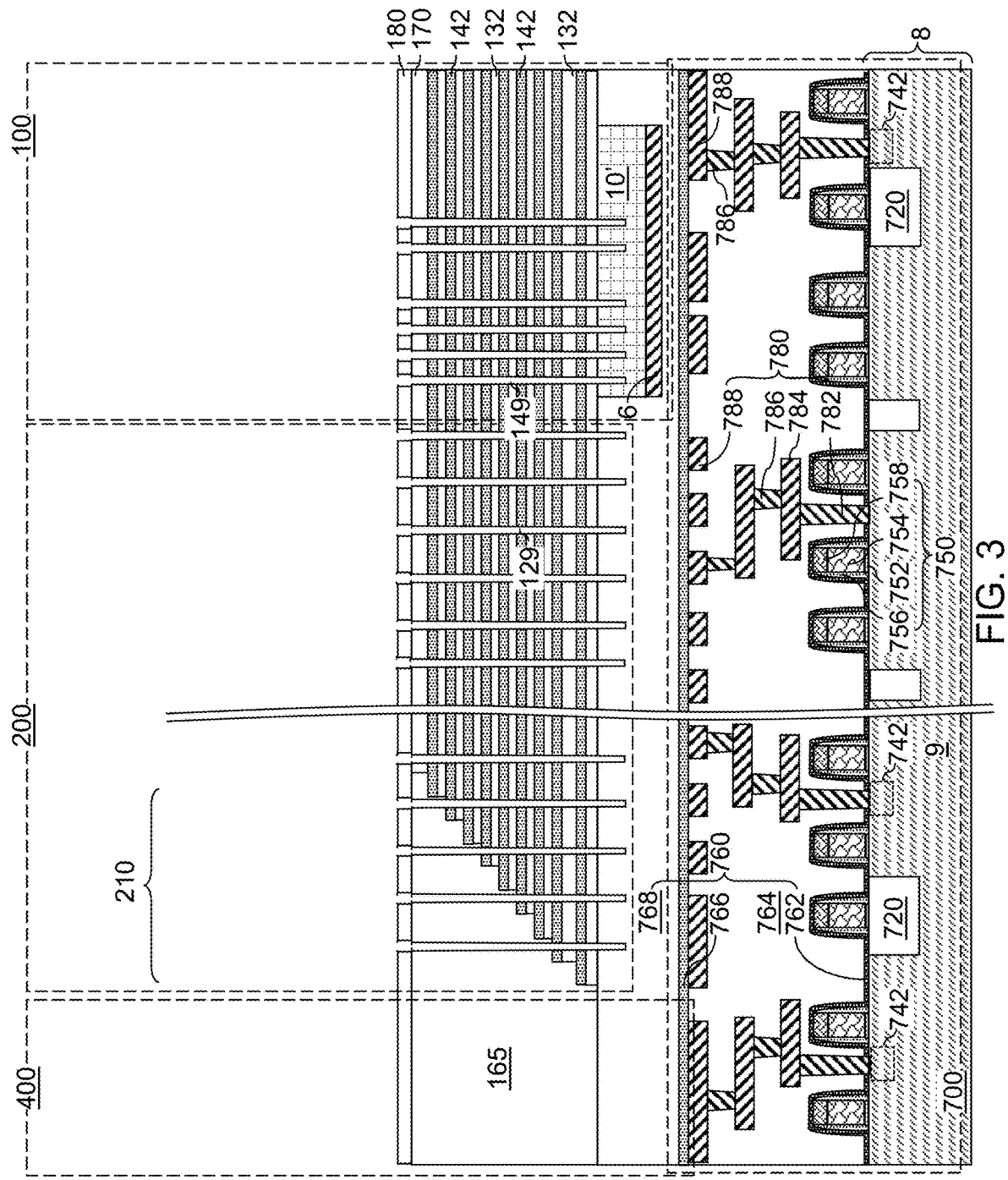

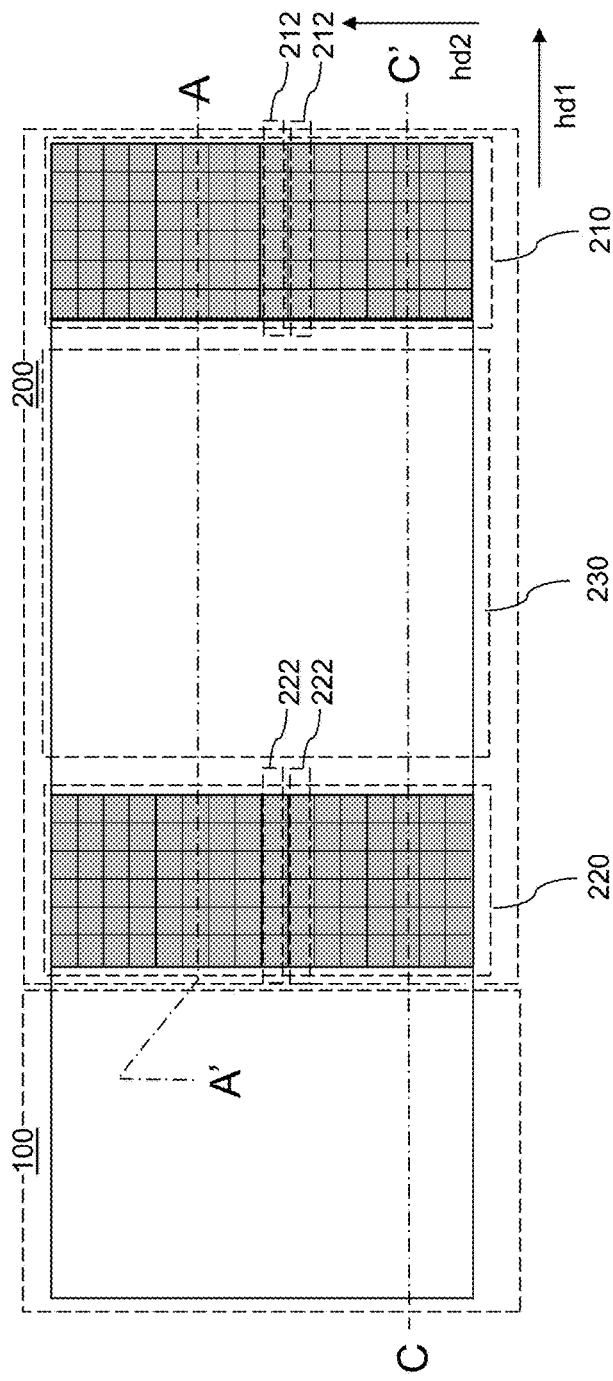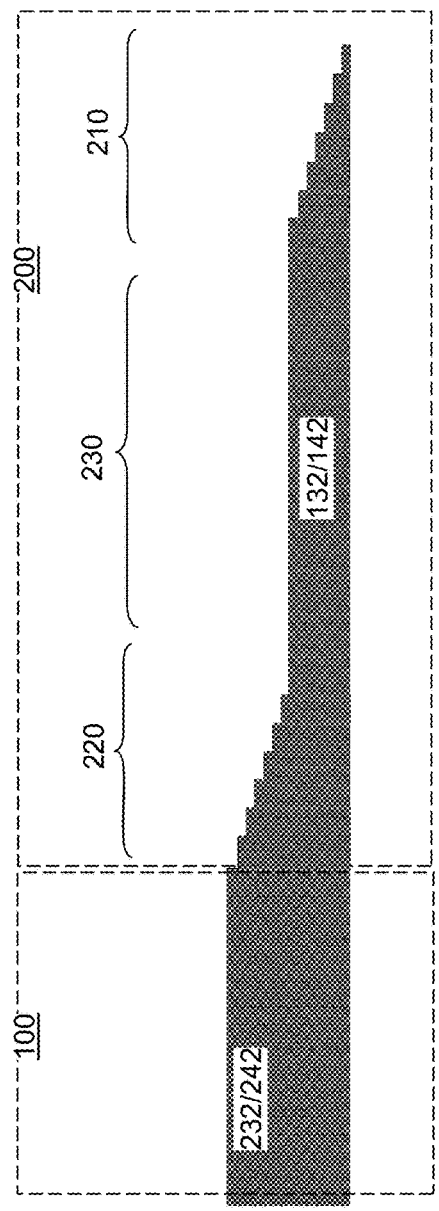

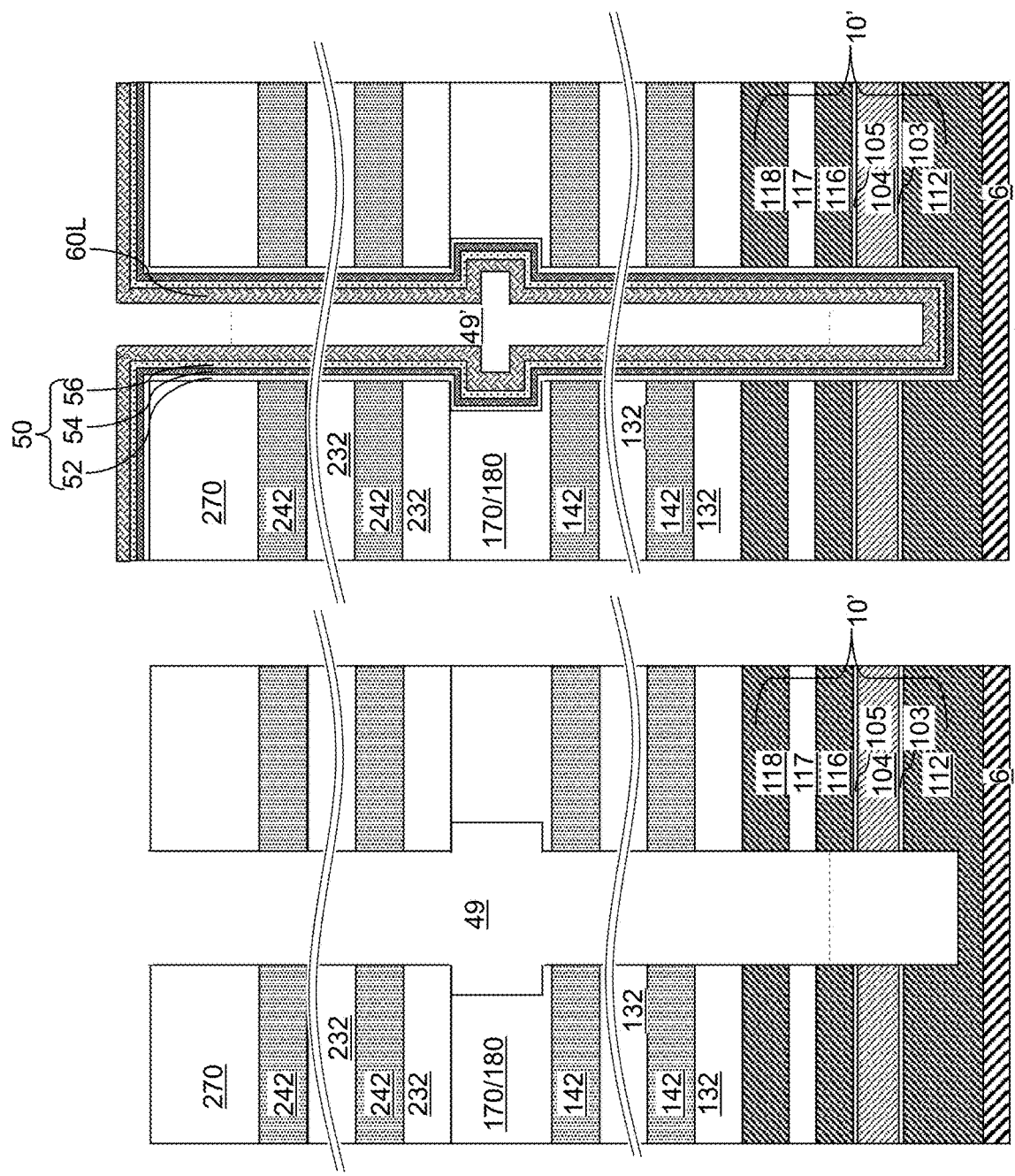

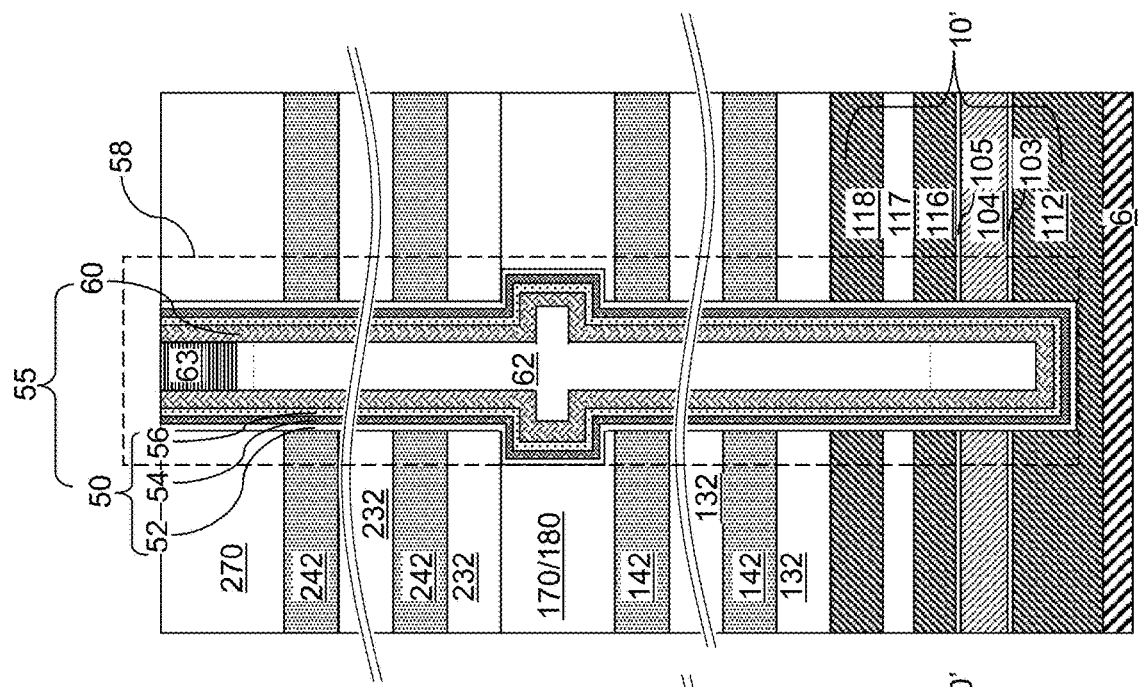
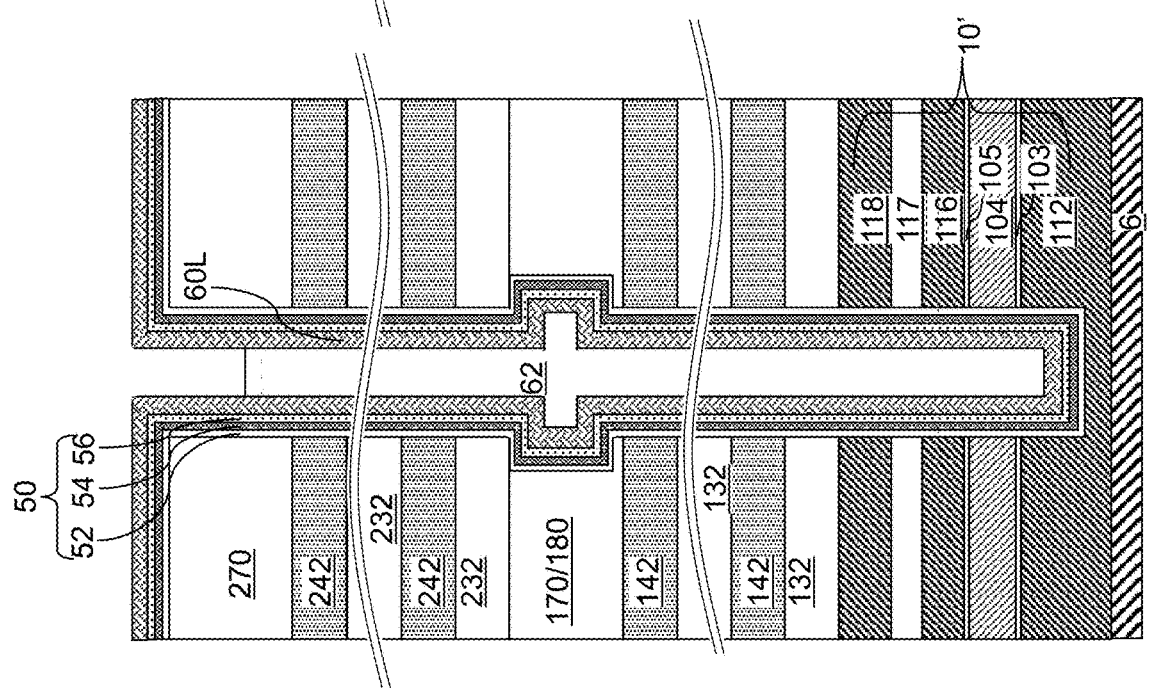

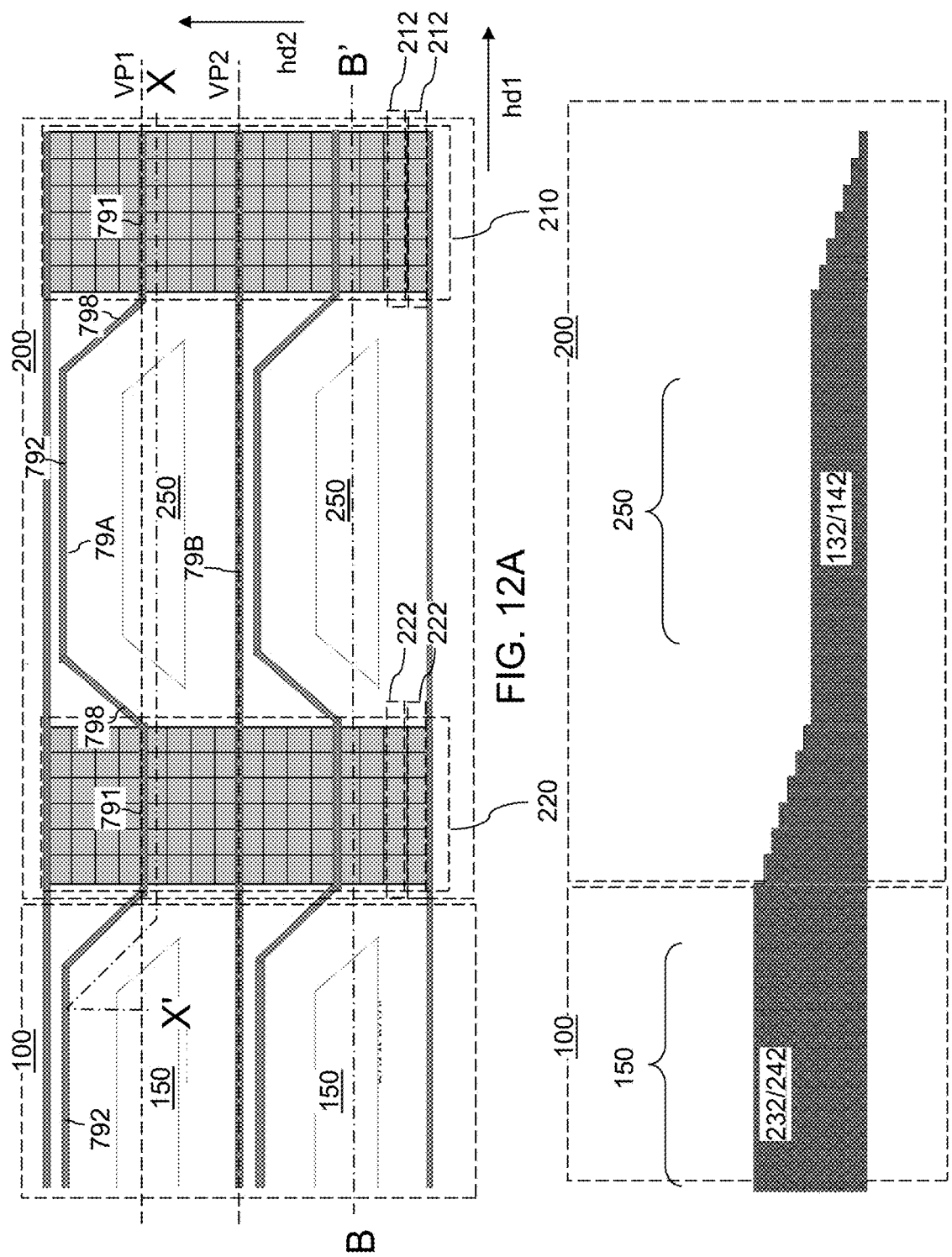

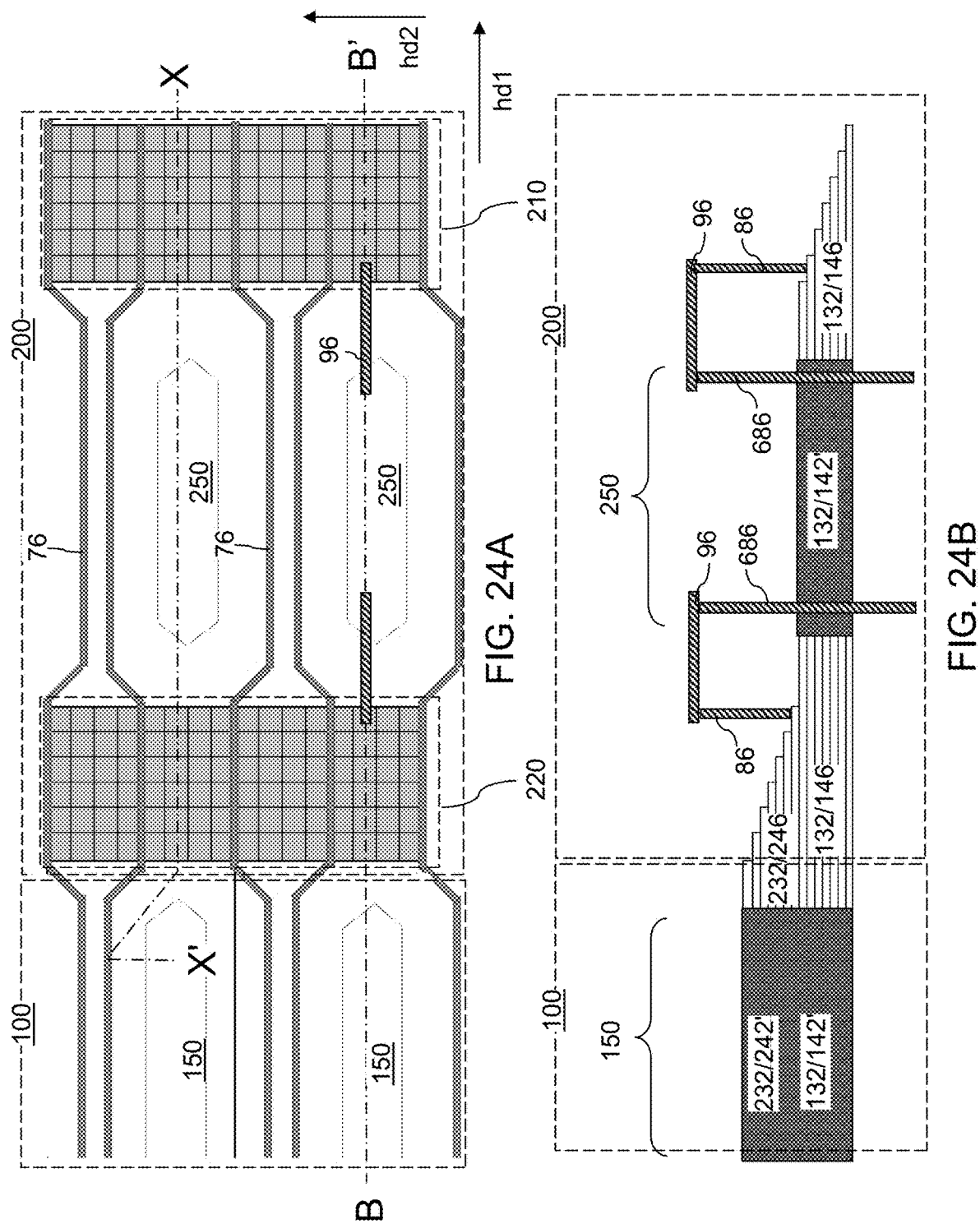

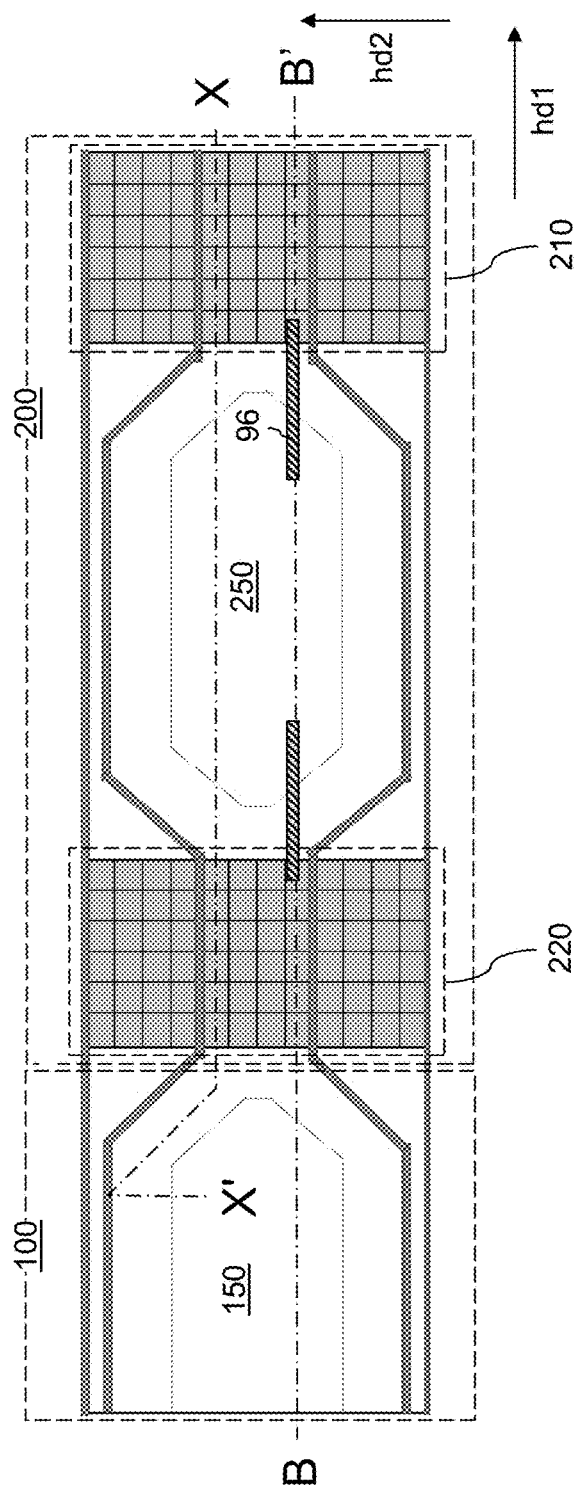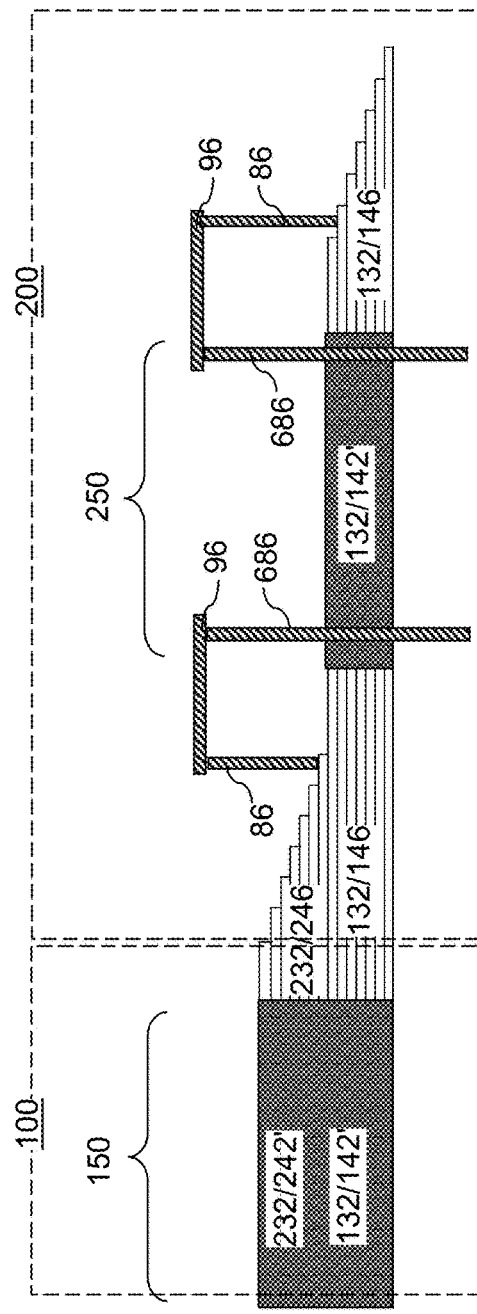

THREE-DIMENSIONAL MEMORY DEVICE INCLUDING SELF-ALIGNED DIELECTRIC ISOLATION REGIONS FOR CONNECTION VIA STRUCTURES AND METHOD OF MAKING THE SAME

FIELD

The present disclosure relates generally to the field of semiconductor devices, and particular to a three-dimensional memory device including dielectric isolation regions that are self-aligned to backside trenches and used to form connection via structures therein and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional semiconductor device is provided, which comprises: alternating stacks of insulating layers and multipart layers located over a substrate, wherein each neighboring pair of alternating stacks is laterally spaced apart from each other by at least one backside trench, wherein each of the multipart layers comprises a respective electrically conductive layer that laterally extends continuously between a respective neighboring pair of backside trenches and at least one dielectric material plate that is laterally enclosed by the respective electrically conductive layer and is laterally spaced from the respective neighboring pair of backside trenches by a uniform lateral offset distance, memory stack structures vertically extending through a respective one of the alternating stacks and comprising a respective vertical semiconductor channel, and a connection via structure vertically extending through the dielectric material portion and through a vertical stack of dielectric material plates and insulating layers within a respective one of the alternating stacks.

According to another embodiment of the present disclosure, a method of forming a three-dimensional semiconductor device is provided, which comprises the steps of: forming a vertically alternating sequence of continuous insulating layers and continuous sacrificial material layers over a substrate; forming memory stack structures vertically extending through the vertically alternating sequence and comprising a respective vertical semiconductor channel; dividing the vertically alternating sequence into alternating stacks of insulating layers and sacrificial material layers by forming backside trenches therethrough, wherein each neighboring pair of alternating stacks is laterally spaced apart from each other by a respective backside trench; replacing the sacrificial material layers with multipart layers by partially replacing the sacrificial material layers with electrically conductive layers, wherein each of the multipart layers comprises a respective electrically conductive layer that laterally extends continuously between a respective neighboring pair of backside trenches and at least one dielectric material plate that is a remaining portion of a respective sacrificial material layer, is laterally enclosed by the respective electrically conductive layer, and is laterally spaced from a most proximal one of the backside trenches by a uniform lateral offset distance.

BRIEF DESCRIPTION OF THE DRAWINGS

FIG. 2B is a top-down view of the exemplary structure of FIG. 2A. The hinged vertical plane A-A' is the plane of the vertical cross-sectional view of FIG. 2A.

FIG. 2C is a schematic vertical cross-sectional view of the exemplary structure along the vertical plane C-C' of FIG. 2B.

FIG. 3 is a vertical cross-sectional view of the exemplary structure after patterning a first-tier staircase region, a first retro-stepped dielectric material portion, an inter-tier dielectric layer, first-tier memory openings, and first-tier support openings according to an embodiment of the present disclosure.

FIG. 5B is a top-down view of the exemplary structure of FIG. 5A. The hinged vertical plane A-A' is the plane of the vertical cross-sectional view of FIG. 5A.

FIG. 5C is a schematic vertical cross-sectional view of the exemplary structure along the vertical plane C-C' of FIG. 5B.

FIGS. 8A-8D illustrate sequential vertical cross-sectional views of a memory opening during formation of a memory opening fill structure according to an embodiment of the present disclosure.

FIG. 12A is a top-down view of a second configuration of the exemplary structure at the processing steps of FIG. 10. The vertical plane X-X' corresponds to the plane of the vertical cross-sectional view of FIG. 10.

FIG. 12B is a schematic vertical cross-sectional view of the second configuration of the exemplary structure along the vertical plane B-B' of FIG. 12A.

FIG. 24A is a top-down view of a first configuration of the exemplary structure at the processing steps of FIG. 23. The vertical plane X-X' corresponds to the plane of the vertical cross-sectional view of FIG. 23.

FIG. 24B is a schematic vertical cross-sectional view of the first configuration of the exemplary structure along the vertical plane B-B' of FIG. 24A.

FIG. 26A is a top-down view of a third configuration of the exemplary structure at the processing steps of FIG. 23. The vertical plane X-X' corresponds to the plane of the vertical cross-sectional view of FIG. 23.

FIG. 26B is a schematic vertical cross-sectional view of the third configuration of the exemplary structure along the vertical plane B-B' of FIG. 26A.

DETAILED DESCRIPTION

Figure 1A:
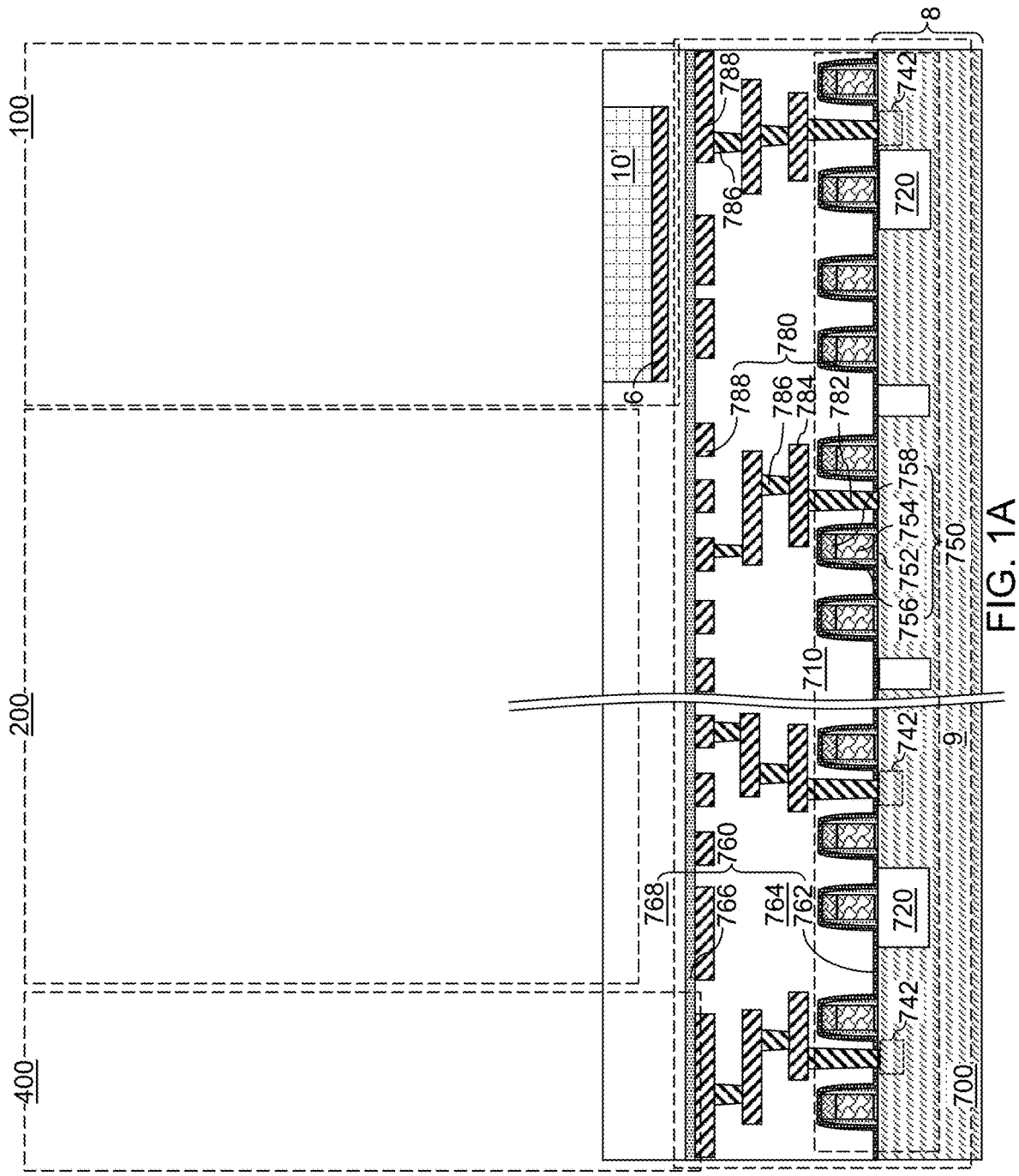
FIG. 1A is a vertical cross-sectional view of an exemplary structure after formation of semiconductor devices, lower level dielectric layers, lower-level metal interconnect structures, and in-process source level material layers on a semiconductor substrate according to a first embodiment of the present disclosure.

As discussed above, the embodiments of the present disclosure are directed to a three-dimensional memory device including dielectric isolation regions that are self-aligned to backside trenches and used for forming connection via structures therein and methods of manufacturing the same. The embodiments of the present disclosure may be used to form various semiconductor devices such as three-dimensional monolithic memory array devices comprising a plurality of NAND memory strings.

The dielectric isolation regions may include an alternating stack of silicon oxide and silicon nitride layers. Thus, the connection via structures that electrically connect the word lines and the underlying word line driver circuits extend through openings in the easy to etch silicon oxide and silicon nitride layers instead of through a stack of hard to etch metal word lines and intervening insulating layers. Furthermore, a separate insulating barrier around the dielectric isolation regions is not required. This further simplifies and reduces the cost of the fabrication process.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulating material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
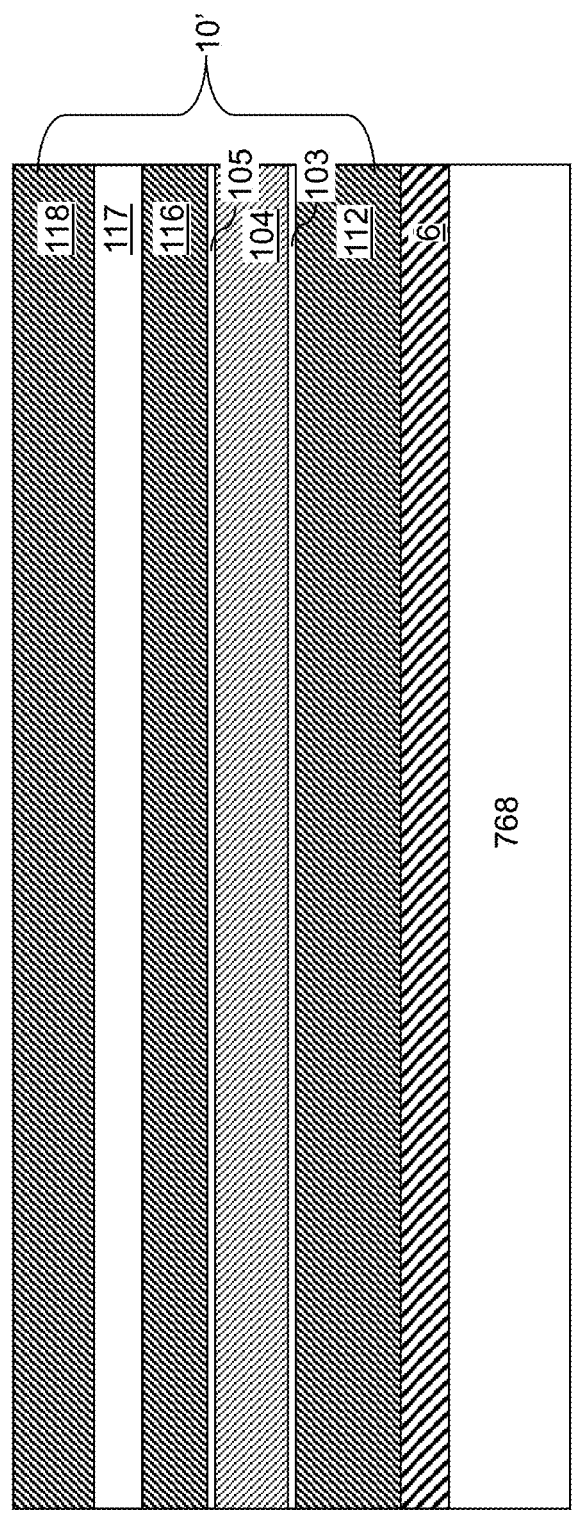
FIG. 1B is a magnified vertical cross-sectional view of the in-process source level material layers of FIG. 1A.

Referring to FIGS. 1A and 1, an exemplary structure according to a first embodiment of the present disclosure is illustrated. FIG. 1B is a magnified view of an in-process source-level material layers 10' illustrated in FIG. 1A. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1 (e.g., word line direction). A horizontal direction that is perpendicular to the first horizontal direction hd1 is herein referred to as a second horizontal direction hd2 (e.g., bit line direction). In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2A:
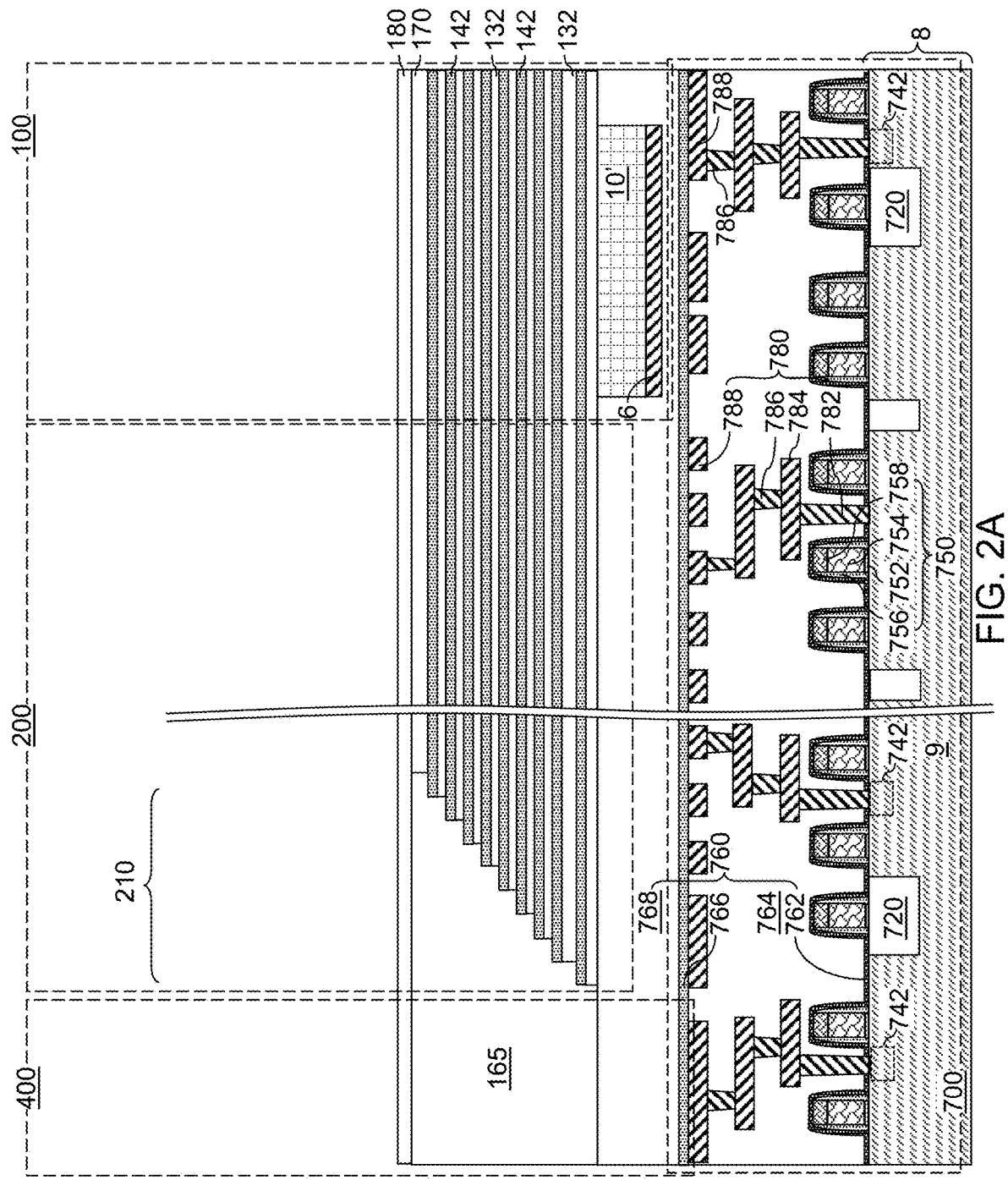
FIG. 2A is a vertical cross-sectional view of the exemplary structure after formation of a first-tier vertically alternating sequence of first insulting layers and first spacer material layers according to an embodiment of the present disclosure.

Referring to FIGS. 2A-2C, a vertically alternating sequence of first material layers and second material layers is subsequently formed. Each first material layer may include a first material, and each second material layer may include a second material that is different from the first material. In case at least another vertically alternating sequence of material layers is subsequently formed over the vertically alternating sequence of the first material layers and the second material layers, the vertically alternating sequence is herein referred to as a first-tier vertically alternating sequence. The level of the first-tier vertically alternating sequence is herein referred to as a first-tier level, and the level of the vertically alternating sequence to be subsequently formed immediately above the first-tier level is herein referred to as a second-tier level, etc.

The first-tier vertically alternating sequence may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, a vertically alternating sequence of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier vertically alternating sequence (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier vertically alternating sequence (132, 142) may have a uniform thickness that is substantially invariant within each respective first sacrificial material layer 142.

A first insulating cap layer 170 is subsequently formed over the first vertically alternating sequence (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

The first insulating cap layer 170 and the first-tier vertically alternating sequence (132, 142) may be patterned to form first stepped surfaces 210 in the staircase region 200. The staircase region 200 may include a respective first stepped area in which the first stepped surfaces 210 are formed, and a second stepped area in which additional stepped surfaces are to be subsequently formed in a second-tier structure (to be subsequently formed over a first-tier structure) and/or additional tier structures. The first stepped surfaces 210 may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area.

The first stepped surfaces 210 may include multiple continuous sets of horizontal surfaces and vertical steps that laterally extend along a first horizontal direction hd1. The multiple continuous sets may be vertically offset by an integer multiple (such as 1, 2, 3, etc.) of the height of a repetition unit in the first alternating sequence (132, 142), i.e., the sum of the thickness of a first insulating layer 132 and a first sacrificial material layer 142. Each continuous set of horizontal surfaces and vertical steps is herein referred to as a first staircase row 212. The first staircase rows 212 can be laterally arranged along a second horizontal direction hd2 that is perpendicular to the first horizontal direction hd1. The height of the physically exposed horizontal surfaces of the first stepped surfaces 210 can be selected such that a set of first staircase rows 212 in each memory block provides horizontal surfaces for each first sacrificial material layer 142 in the first alternating sequence (132, 142) or for each first insulating layer 132 in the first alternating sequence (132, 142). In one embodiment, top surfaces of the first sacrificial material layers 142 may be physically exposed at the first stepped surfaces 210. The cavity overlying the first stepped surfaces 210 is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces 210 constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Referring to FIG. 3, various first-tier openings (149, 129) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) may include first-tier memory openings 149 and first-tier support openings 129.

The first-tier memory openings 149 are openings that are formed in the memory array region 100 through each layer within the first vertically alternating sequence (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces 210.

In one embodiment, the first anisotropic etch process may include an initial step in which the materials of the first-tier vertically alternating sequence (132, 142) are etched concurrently with the material of the first retro-stepped dielectric material portion 165. The chemistry of the initial etch step may alternate to optimize etching of the first and second materials in the first-tier vertically alternating sequence (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the vertically alternating sequence (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier vertically alternating sequence (to be subsequently formed prior to formation of the second-tier memory openings).

Figure 4:
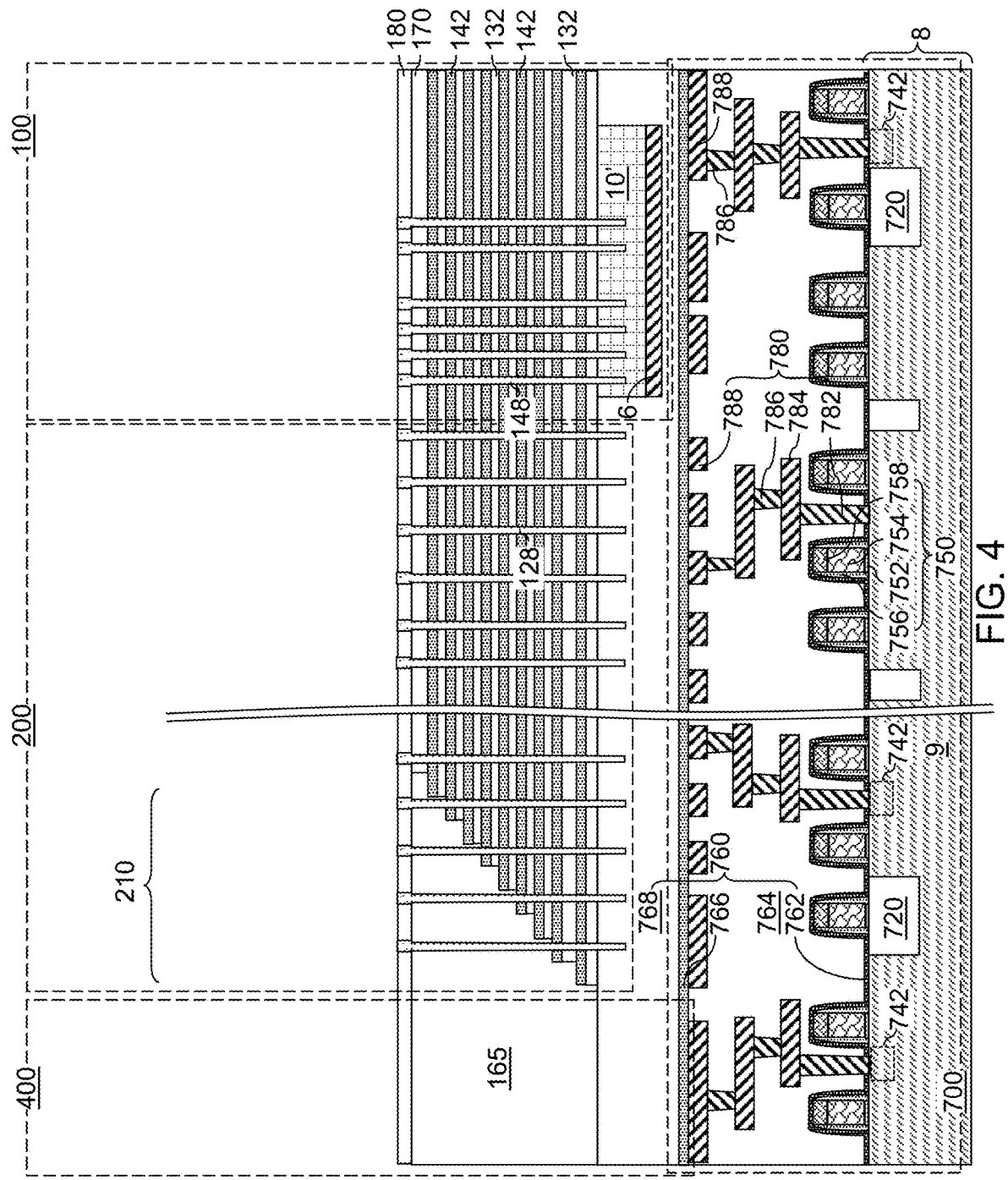
FIG. 4 is a vertical cross-sectional view of the exemplary structure after formation of various sacrificial fill structures according to an embodiment of the present disclosure.

Referring to FIG. 4, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first vertically alternating sequence (132, 142).

Portions of the deposited sacrificial material may be removed from above the topmost layer of the first-tier vertically alternating sequence (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 5A:
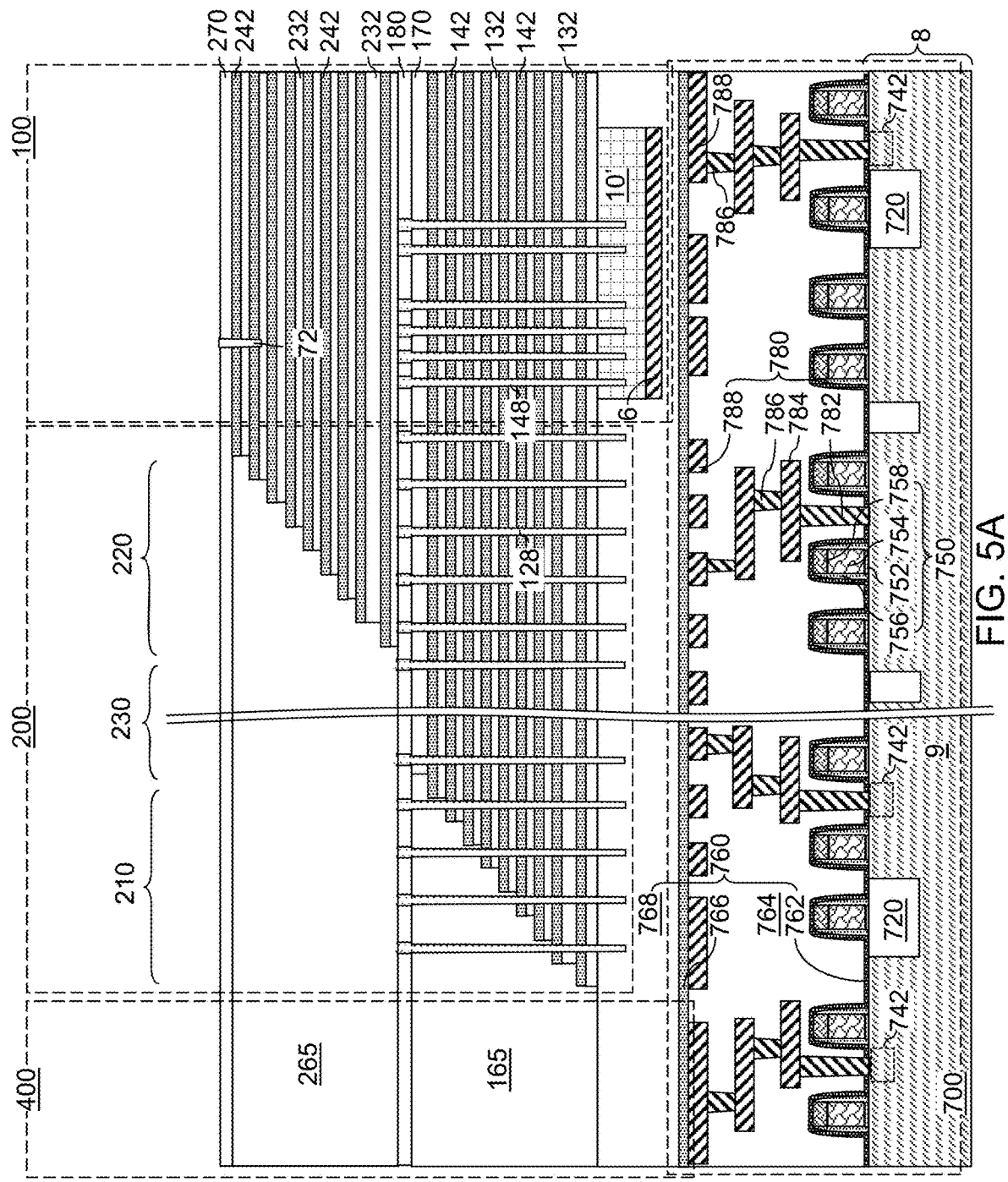
FIG. 5A is a vertical cross-sectional view of the exemplary structure after formation of a second-tier vertically alternating sequence of second insulating layers and second spacer material layers, second stepped surfaces, and a second retro-stepped dielectric material portion according to an embodiment of the present disclosure.

Referring to FIG. 5A-5C, a second-tier structure may be formed over the first-tier structure (132, 142, 170, 148). The second-tier structure may include an additional vertically alternating sequence of insulating layers and spacer material layers, which may be sacrificial material layers. For example, a second vertically alternating sequence (232, 242) of material layers may be subsequently formed on the top surface of the first vertically alternating sequence (132, 142). The second vertically alternating sequence (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second vertically alternating sequence (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second vertically alternating sequence (232, 242) may have a uniform thickness that is substantially invariant within each respective second sacrificial material layer 242.

Second stepped surfaces 220 in the second stepped area may be formed in the staircase region 200 using a same set of processing steps as the processing steps used to form the first stepped surfaces 210 in the first stepped area with suitable adjustment to the pattern of at least one masking layer. In one embodiment, the area including the second stepped surfaces 220 may be laterally offset from the area including the first stepped surfaces 210 by a region 230 that is free of stepped surfaces. According to an aspect of the present disclosure, a portion of this area can be subsequently used to provide dielectric isolation regions in which connection via structures can be formed. A second retro-stepped dielectric material portion 265 may be formed over the second stepped surfaces 220 in the staircase region 200.

The second stepped surfaces 220 can include multiple continuous sets of horizontal surfaces and vertical steps that laterally extend along the first horizontal direction hd1. The multiple continuous sets can be vertically offset by an integer multiple of the height of a repetition unit in the second alternating sequence (232, 242), i.e., the sum of the thickness of a second insulating layer 232 and a second sacrificial material layer 242. Each continuous set of horizontal surfaces and vertical steps is herein referred to as a second staircase row 222. The second staircase rows 222 can be laterally arranged along the second horizontal direction hd2. The height of the physically exposed horizontal surfaces of the second stepped surfaces 220 can be selected such that a set of second staircase rows 222 in a memory block provides horizontal surfaces for each second sacrificial material layer 242 in the second alternating sequence (232, 242) or for each second insulating layer 232 in the second alternating sequence (232, 242). In one embodiment, top surfaces of the second sacrificial material layers 242 may be physically exposed at the second stepped surfaces 220. The cavity overlying the second stepped surfaces 220 is herein referred to as a second stepped cavity.

A second insulating cap layer 270 may be subsequently formed over the second vertically alternating sequence (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one vertically alternating sequence of insulating layers (132, 232) and spacer material layers (such as sacrificial material layers (142, 242)) may be formed over the in-process source-level material layers 10′, and at least one retro-stepped dielectric material portion (165, 265) may be formed over the staircase regions on the at least one vertically alternating sequence (132, 142, 232, 242). Each of the insulating layers (132, 232) can be a continuous insulating layer that extends over the entire area of the memory array region 100 and have a progressively lesser area that decreases with a vertical distance from the substrate 8 in the staircase region 200. Each of the sacrificial material layers (142, 242) can be a continuous sacrificial material layer that extends over the entire area of the memory array region 100 and have a progressively lesser area that decreases with a vertical distance from the substrate 8 in the staircase region 200.

Optionally, drain-select-level isolation structures 72 may be formed through a subset of layers in an upper portion of the second-tier vertically alternating sequence (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second vertically alternating sequence (232, 242), the second retro-stepped dielectric material portion 265, the second insulating cap layer 270, and the optional drain-select-level isolation structures 72 collectively constitute a second-tier structure (232, 242, 265, 270, 72).

Figure 6:
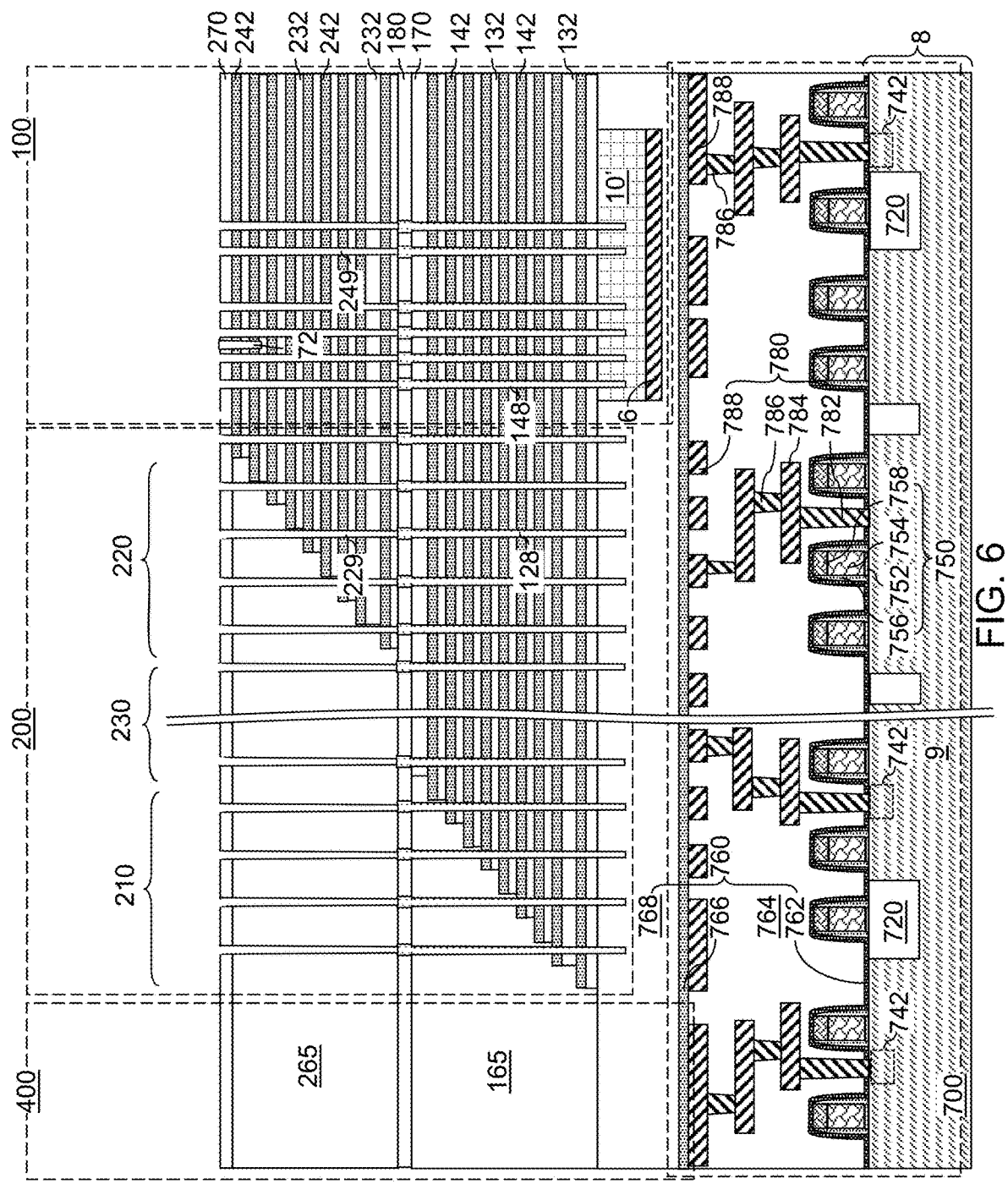
FIG. 6 is a vertical cross-sectional view of the exemplary structure after formation of second-tier memory openings and second-tier support openings according to an embodiment of the present disclosure.

Referring to FIG. 6, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces 220, which include the interfacial surfaces between the second vertically alternating sequence (232, 242) and the second retro-stepped dielectric material portion 265.

The second anisotropic etch process may include an etch step in which the materials of the second-tier vertically alternating sequence (232, 242) are etched concurrently with the material of the second retro-stepped dielectric material portion 265. The chemistry of the etch step may alternate to optimize etching of the materials in the second-tier vertically alternating sequence (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 7:
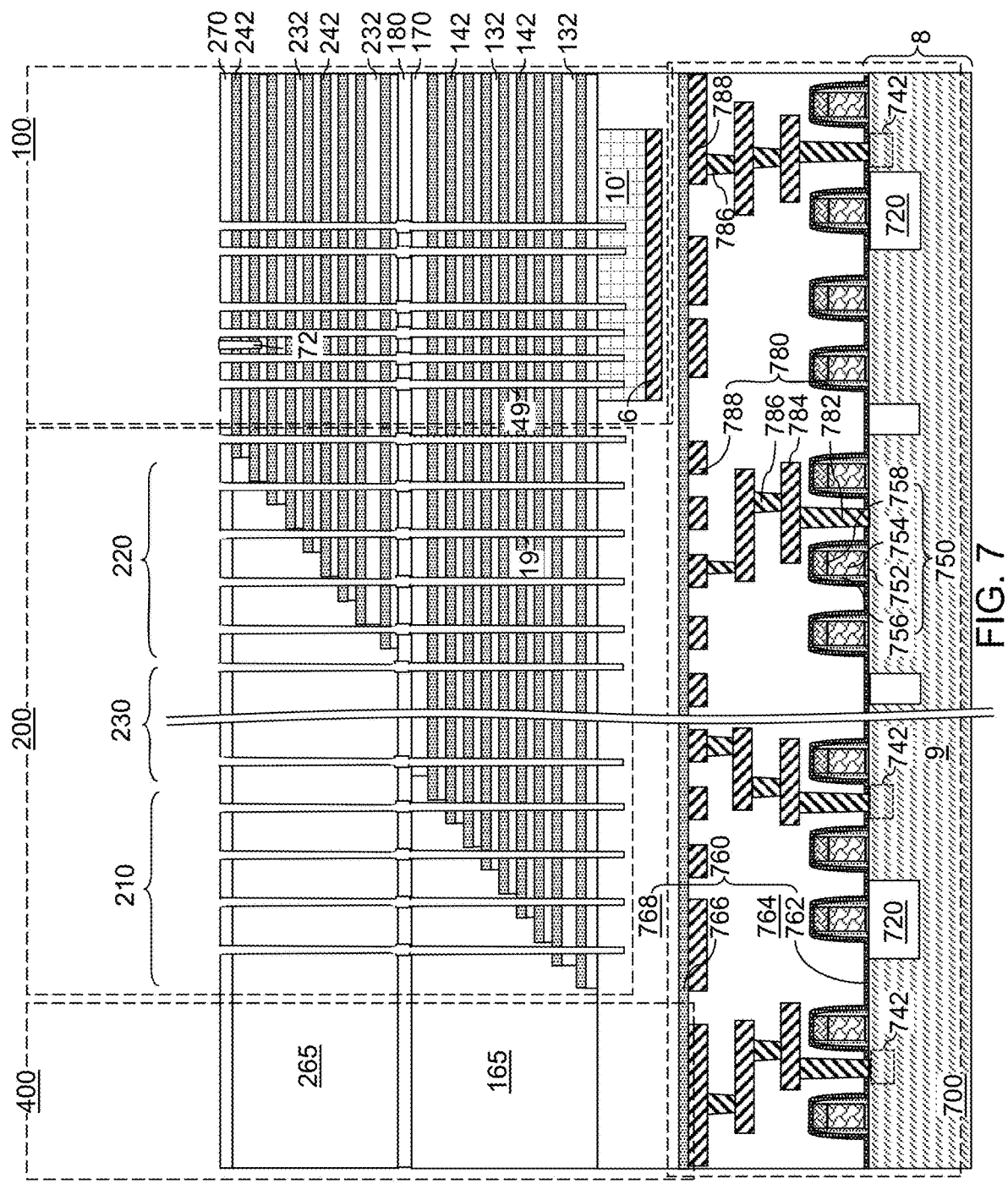
FIG. 7 is a vertical cross-sectional view of the exemplary structure after formation of inter-tier memory openings and inter-tier support openings according to an embodiment of the present disclosure.

Referring to FIG. 7, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 8A-8D provide sequential cross-sectional views of a memory opening 49 during formation of a memory opening fill structure. The same structural change occurs in each of the memory openings 49 and the support openings 19.

Referring to FIG. 8A, a memory opening 49 in the first exemplary device structure of FIG. 7 is illustrated. The memory opening 49 extends through the first-tier structure and the second-tier structure.

Referring to FIG. 8B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphorus atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 8C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 8D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 9:
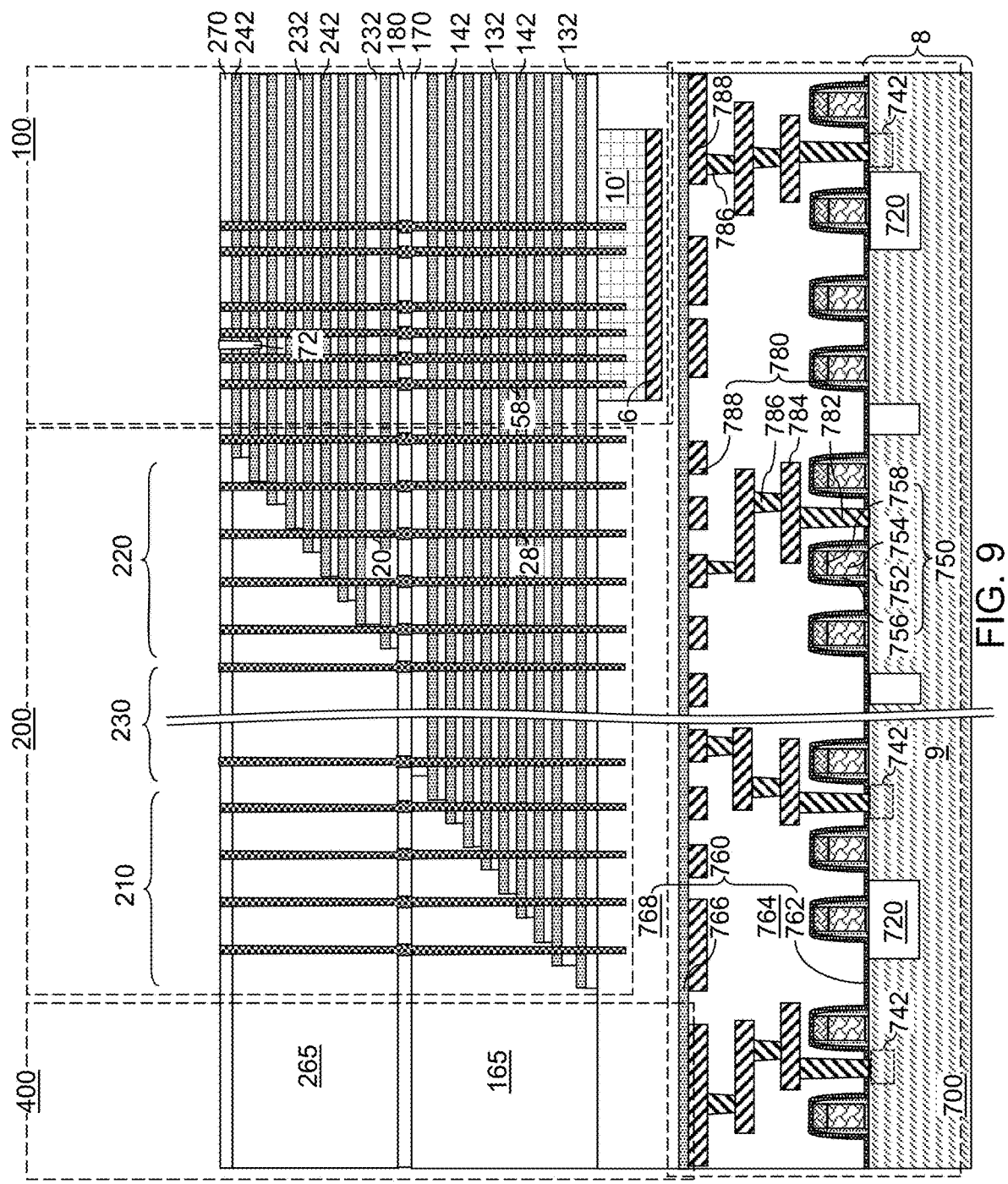
FIG. 9 is a vertical cross-sectional view of the exemplary structure after formation of memory opening fill structures and support pillar structures according to an embodiment of the present disclosure.

Referring to FIG. 9, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 10:
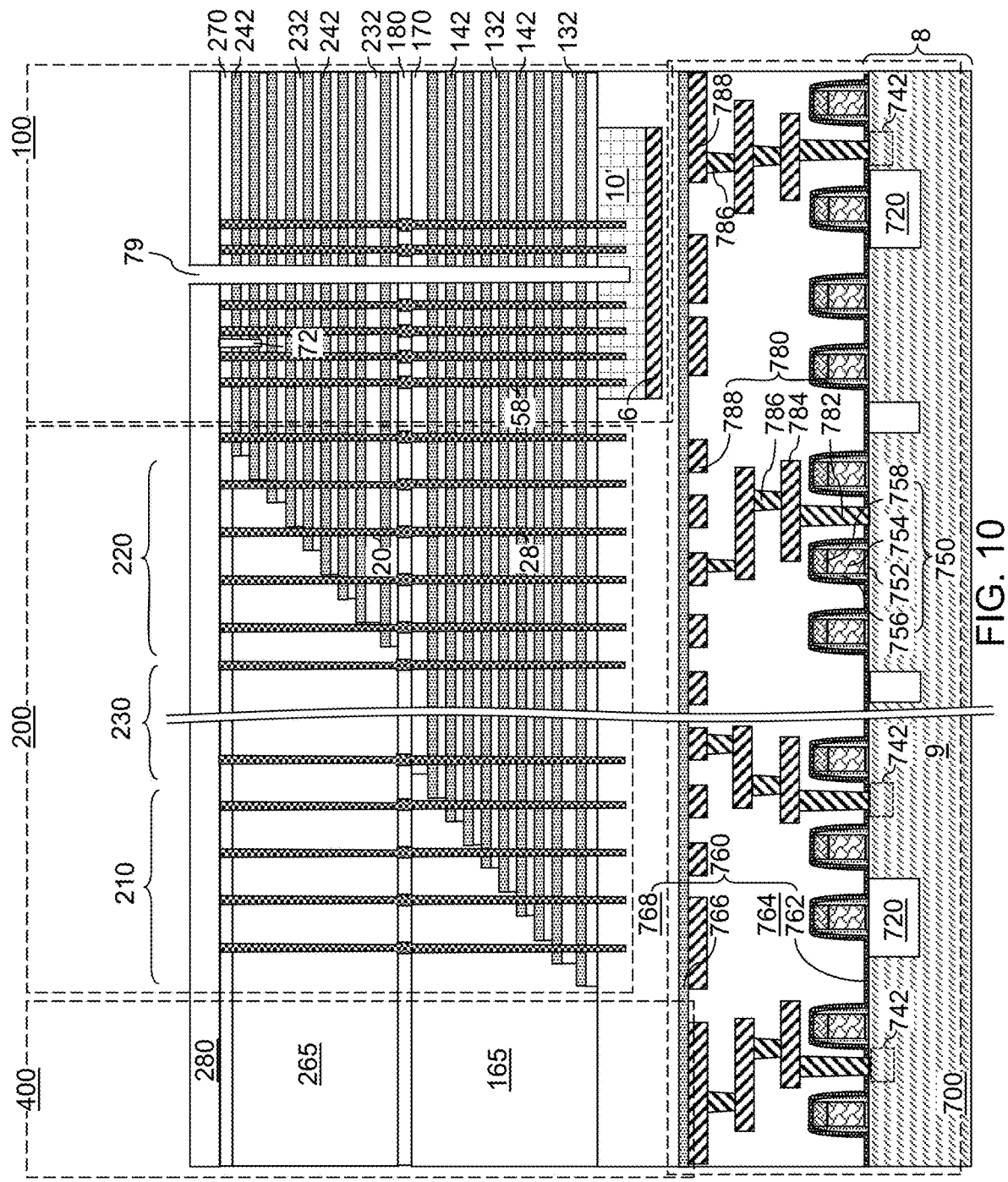
FIG. 10 is a vertical cross-sectional view of the exemplary structure after formation of a first contact level dielectric layer and backside trenches according to an embodiment of the present disclosure.

Referring to FIG. 10, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form elongated openings within areas in which memory opening fill structures 58 and the support pillar structures 20 are not present. The elongated openings include lengthwise segments that extend along the first horizontal direction hd1 and angled segments that extend along a horizontal direction that is not parallel to the first horizontal direction hd1. In one embodiment, the angled segments may extend along at least one horizontal direction that is at an angle in a range from 15 degrees to 75 degrees with respect to the first horizontal direction hd1. The elongated openings in the photoresist layer can extend between clusters of memory opening fill structures 58 in the memory array region 100 and between clusters of support pillar structures 20 in the staircase region 200.

Backside trenches 79 may be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 10'. Portions of the first contact level dielectric layer 280, the second-tier structure (232, 242, 270, 265, 72), the first-tier structure (132, 142, 170, 165), and the in-process source-level material layers 10' that underlie the openings in the photoresist layer may be removed to form the backside trenches 79. In one embodiment, the backside trenches 79 can laterally extend between neighboring clusters of memory stack structures 55 and between neighboring clusters of support pillar structures 20. Consequently, neighboring clusters of the memory stack structures 55 can be laterally spaced apart by the backside trenches 79. The photoresist layer can be subsequently removed, for example, by ashing.

The vertically alternating sequence of continuous insulating layers (such as the first insulating layers 132 and the second insulating layers 232) and continuous sacrificial material layers (such as the first sacrificial material layer 142 and the second sacrificial material layers 242) can be divided into alternating stacks of insulating layers (each being a patterned portion of the first insulating layers 132 and the second insulating layers 232 as provided at the processing steps of FIG. 9) and sacrificial material layers (each being a patterned portion of the first sacrificial material layers 142 and the second sacrificial material layers 242 as provided at the processing steps of FIG. 9) by forming the backside trenches 79 therethrough. Each patterned portions of the continuous insulating layers is herein referred to as an insulating layer, and each patterned portion of the continuous sacrificial material layer is herein referred to as a sacrificial material layer for the purpose of description of the present disclosure. Alternating stacks of insulating layers (132, 232) and sacrificial material layers (142, 242) are laterally spaced apart by the backside trenches 79.

According to an aspect of the present disclosure, the lateral spacing between neighboring pairs of backside trenches 79 can be different in different areas. In some embodiments, multiple areas having different widths along the second horizontal direction hd2 (e.g., bit line direction) can be formed between a neighboring pair of backside trenches 79. Various patterns may be used for the backside trenches 79 to provide the multiple areas having different widths along the second horizontal direction hd2 between a neighboring pair of backside trenches 79. Correspondingly, various configurations for the backside trenches 79 may be used to provide different patterns for a continuous area between a pair of backside trenches 79 that has different regions having different widths along the second horizontal direction hd2. Generally, each neighboring pair of alternating stacks is laterally spaced apart from each other by a respective backside trench 79. The respective pair of backside trenches 79 generally extend along the first horizontal direction hd1 (e.g., word line direction) with portions that are non-parallel to the first horizontal direction and with a modulation in a lateral separation distance along the second horizontal direction hd2 therebetween. The second horizontal direction hd2 is perpendicular to the first horizontal direction hd1. In one embodiment, each memory block is located between a neighboring pair of backside trenches 79, and the width of each memory block in the bit line direction hd2 varies along the word line direction hd1. The wider portions of each memory block include the dielectric isolation regions, such that at least one connection via structure is later formed through the dielectric isolation region to electrically connects word lines that will be formed in place of the sacrificial material layers to the word line driver circuit devices 710 in underlying peripheral device region 700.

FIGS. 11A and 11B, 12A and 12B, and 13A and 13B illustrate a first configuration, a second configuration, and a third configuration of the exemplary structure at the processing steps of FIG. 10, respectively. The hinged vertical cross-sectional planes X-X' in each of FIGS. 11A, 12A, and 13A correspond to the plane of the vertical cross-sectional view of FIG. 10. The vertical cross-sectional planes B-B' in each of FIGS. 11A, 12A, and 13A correspond to the planes of the vertical cross-sectional views of FIGS. 11B, 12B, and 13B, respectively.

Generally, a neighboring pair of backside trenches 79 can comprise a first backside trench 79A that includes first backside trench segments 791 that are centered around a first vertical plane VP1 extending along the first horizontal direction hd1 and are laterally spaced apart along the first horizontal direction hd1, second backside trench segments 792 that are laterally offset from the first vertical plane VP1 along a second horizontal direction hd2 that is perpendicular to the first horizontal direction hd1, and connection backside trench segments 798 that connect the second backside trench segments 792 to a respective one of the first backside trench segments 791. Each of the connection backside trench segments 798 laterally extends along a respective horizontal direction that is at an angle in a range from 15 degrees to 90 degrees, such as from 20 degrees to 75 degrees, including from 30 degrees to 60 degrees, with respective to the first horizontal direction hd1.

Figures 11A, 11B:
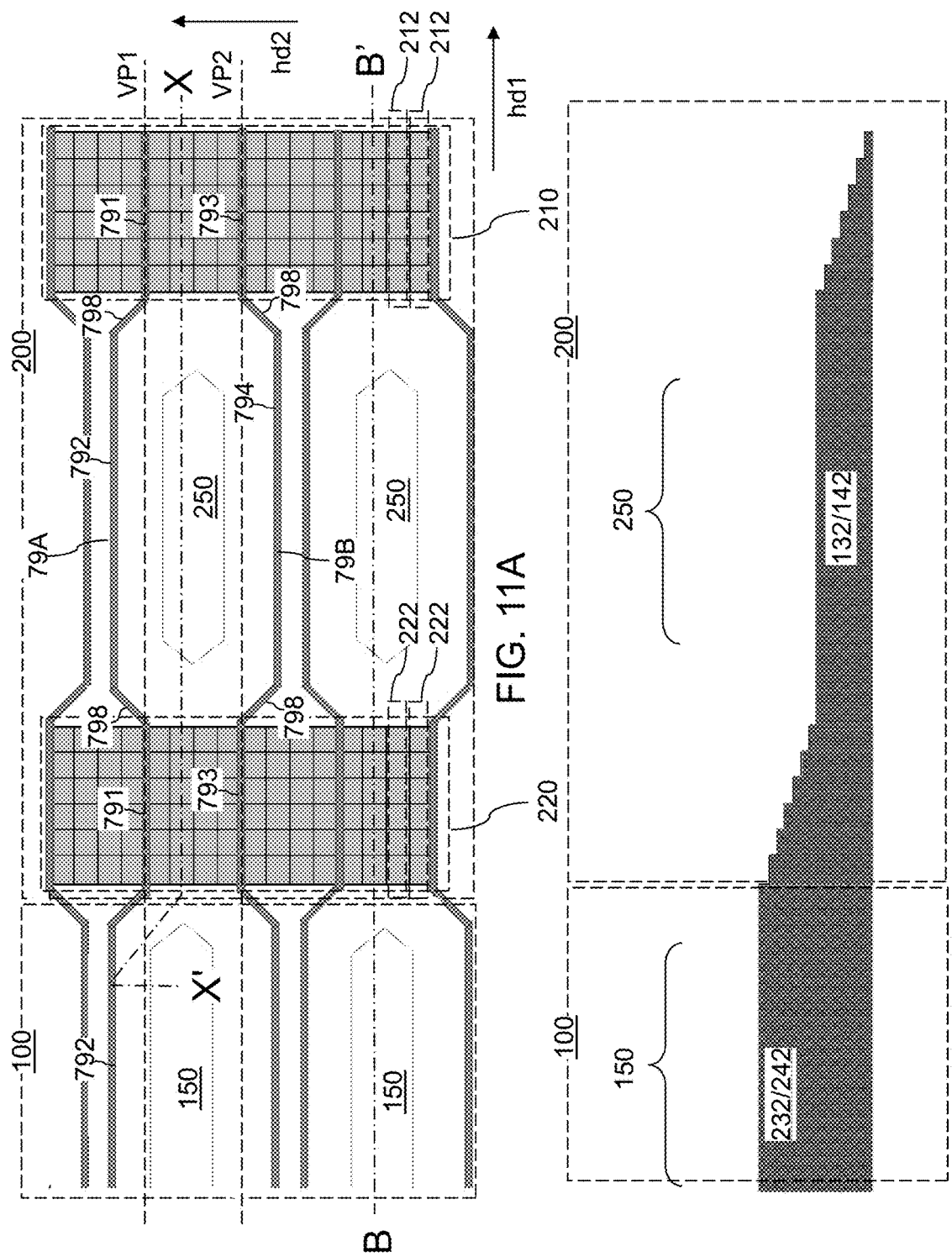
FIG. 11A is a top-down view of a first configuration of the exemplary structure at the processing steps of FIG. 10. The vertical plane X-X' corresponds to the plane of the vertical cross-sectional view of FIG. 10.
FIG. 11B is a schematic vertical cross-sectional view of the first configuration of the exemplary structure along the vertical plane B-B' of FIG. 11A.

In some embodiments, the neighboring pair of backside trenches 79 comprises a second backside trench 79B that includes third backside trench segments 793 that are centered around a second vertical plane VP2 extending along the first horizontal direction hd1 and are laterally spaced apart along the first horizontal direction hd1, a fourth backside trench segment 894 that is laterally offset from the second vertical plane VP2 along the second horizontal direction hd2, and additional connection backside trench segments 798 that connect the fourth backside trench segments 894 to a respective one of the third backside trench segments 893 as illustrated in FIGS. 11A and 11B.

Each neighboring pair of backside trenches 79 can be positioned such that each contiguous set of first staircase rows 212 that provides horizontal surfaces for each first sacrificial material layer 142 in the first alternating stack (132, 142) or for each first insulating layer 132 in the first alternating stack (132, 142) is present between the neighboring pair of backside trenches 79. Further, each neighboring pair of backside trenches 79 can be positioned such that each contiguous set of second staircase rows 222 that provides horizontal surfaces for each second sacrificial material layer 242 in the second alternating stack (232, 242) or for each second insulating layer 232 in the second alternating stack (232, 242) is present between the neighboring pair of backside trenches 79.

In some embodiment, the neighboring pair of backside trenches 79 comprises a second backside trench 79B that extends along the first horizontal direction hd1 throughout an entirety thereof, and centered around a second vertical plane VP2 that is perpendicular to the second horizontal direction as illustrated in FIGS. 12A, 12B, 13A, and 13B.

Figure 13A:
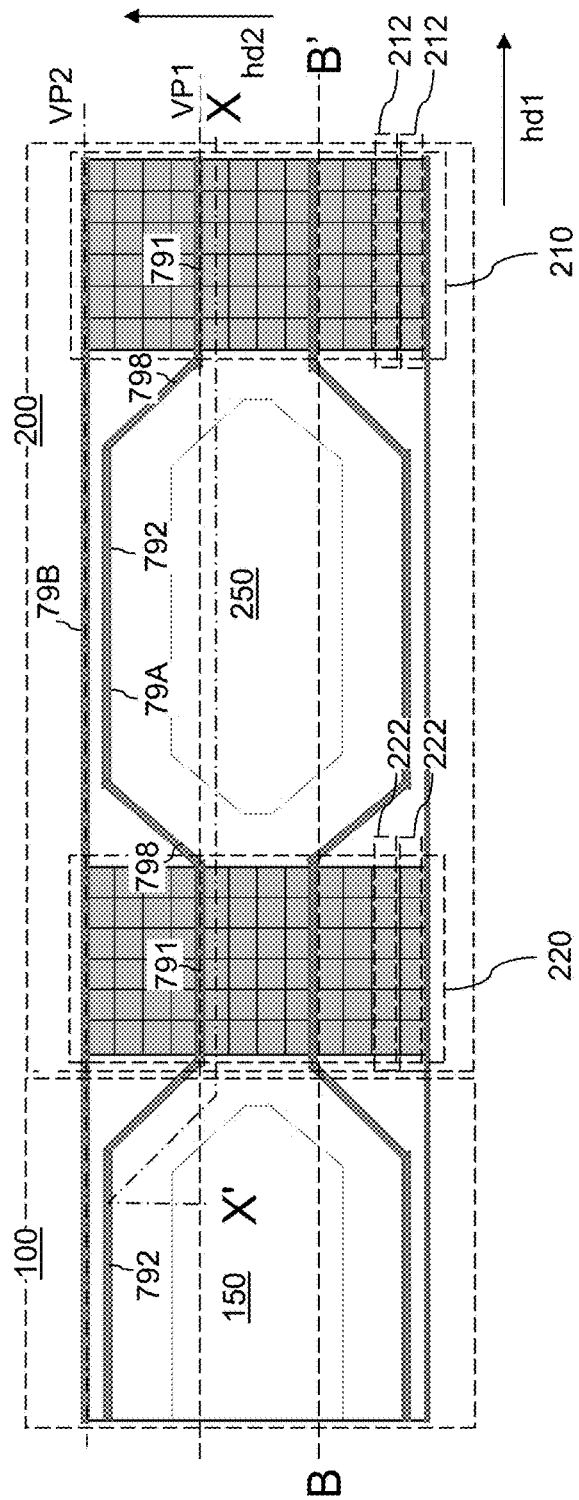
FIG. 13A is a top-down view of a third configuration of the exemplary structure at the processing steps of FIG. 10. The vertical plane X-X' corresponds to the plane of the vertical cross-sectional view of FIG. 10.
Figure 13B:
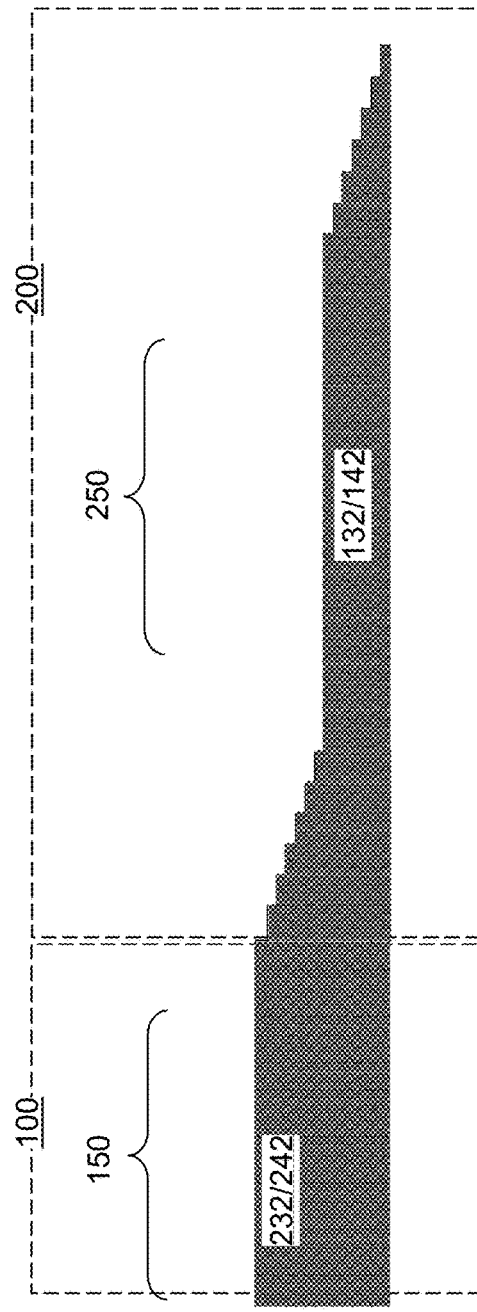
FIG. 13B is a schematic vertical cross-sectional view of the third configuration of the exemplary structure along the vertical plane B-B' of FIG. 13A.

The pattern of the combination of the first backside trench 79A and the second backside trench 79B may be repeated with a periodicity along the second horizontal direction hd2 as illustrated in FIGS. 11A and 12A. Alternatively, a unit pattern may include a combination of the first backside trench 79A and the second backside trench 79B and a mirror image of the combination may be repeated along the second horizontal direction hd2 as illustrated in FIG. 13A. Such a pattern may be repeated along the second horizontal direction.

Areas within the staircase region 200, such as region 230 described above, and optionally in the memory array region 100 that are laterally spaced apart from most proximal backside trenches 79 by a lateral distance greater than a target lateral etch distance for the sacrificial material layers (142, 242) in a subsequent isotropic etch step are herein referred to as dielectric isolation regions (150, 250). The target lateral etch distance can be greater than one half of a lateral separation distance between the first backside trench segments 791 of the first backside trench 79A and a most proximate second backside trench 79B. The target lateral etch distance can be greater than one half of the width each contiguous set of first staircase rows 212 that provides horizontal surfaces for each first sacrificial material layer 142 in the first alternating stack (132, 142) or for each first insulating layer 132 in the first alternating stack (132, 142)

along the second horizontal direction hd2, and can be greater than one half of the width of each contiguous set of second staircase rows 222 that provides horizontal surfaces for each second sacrificial material layer 242 in the second alternating stack (232, 242) or for each second insulating layer 232 in the second alternating stack (232, 242) along the second horizontal direction hd2. The dielectric isolation regions can include optional array dielectric isolation regions 150 that are formed within the memory array region 100, and staircase dielectric isolation region 250 that are formed in the staircase region 200. The periphery of each of the dielectric isolation regions (150, 250) can be laterally spaced from sidewalls of a most proximal subset of the backside trenches 79 by a uniform lateral offset distance, which can be the target lateral etch distance of the isotropic etch process to be subsequently employed.

Figure 14:
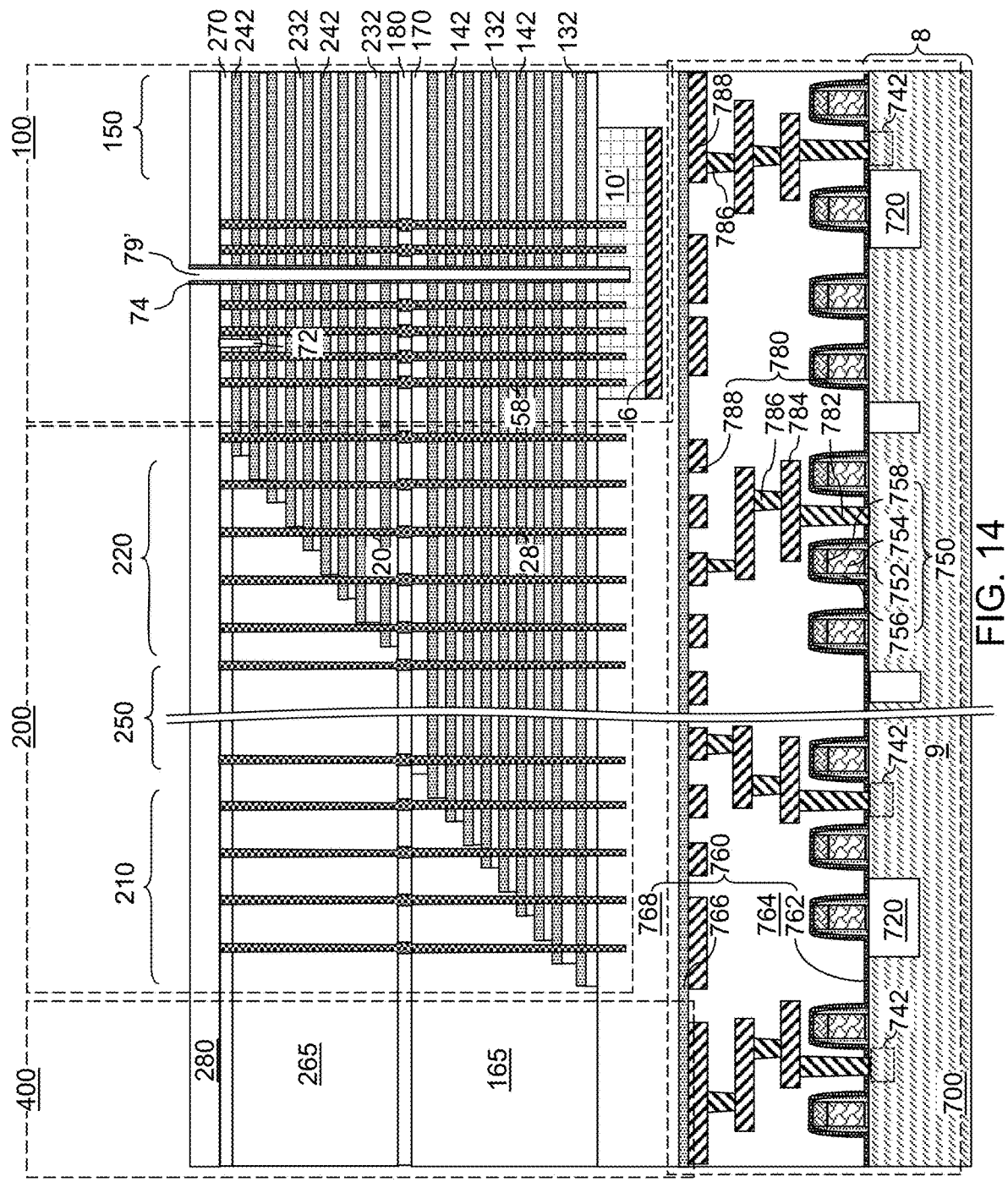
FIG. 14 is a vertical cross-sectional view of the exemplary structure after formation of backside trench spacers according to an embodiment of the present disclosure.
Figure 15A:
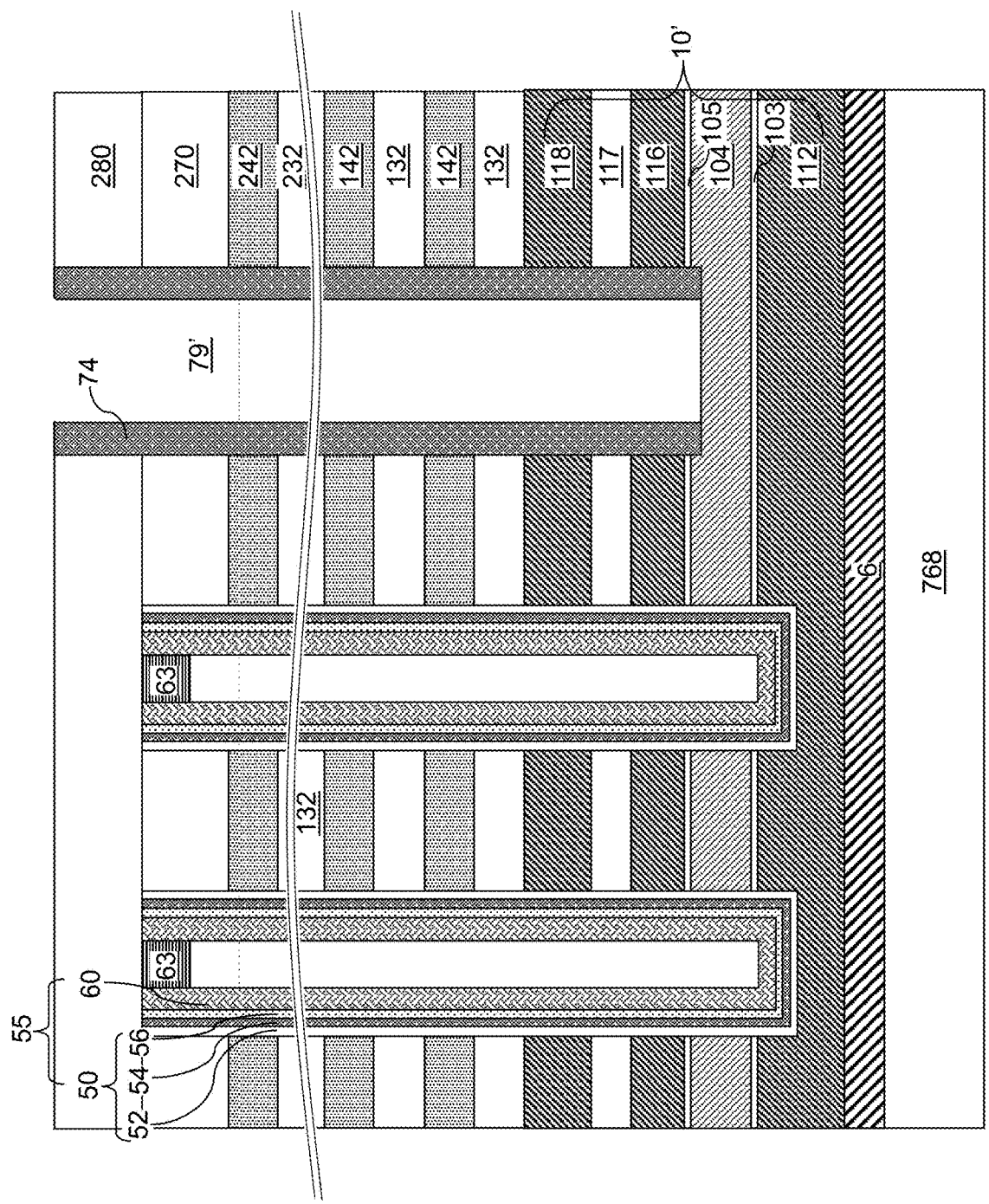
FIGS. 15A-15E illustrate sequential vertical cross-sectional views of memory opening fill structures and a backside trench during formation of source-level material layers according to an embodiment of the present disclosure.

Referring to FIGS. 14 and 15A, a backside trench spacer 74 may be formed on sidewalls of each backside trench 79. For example, a conformal spacer material layer may be deposited in the backside trenches 79 and over the first contact level dielectric layer 280, and may be anisotropically etched to form the backside trench spacers 74. The backside trench spacers 74 include a material that is different from the material of the source-level sacrificial layer 104. For example, the backside trench spacers 74 may include silicon nitride. A backside cavity 79' is present within the volume of each backside trench 79 that is not filled with a backside trench spacer 74.

Figure 15B:
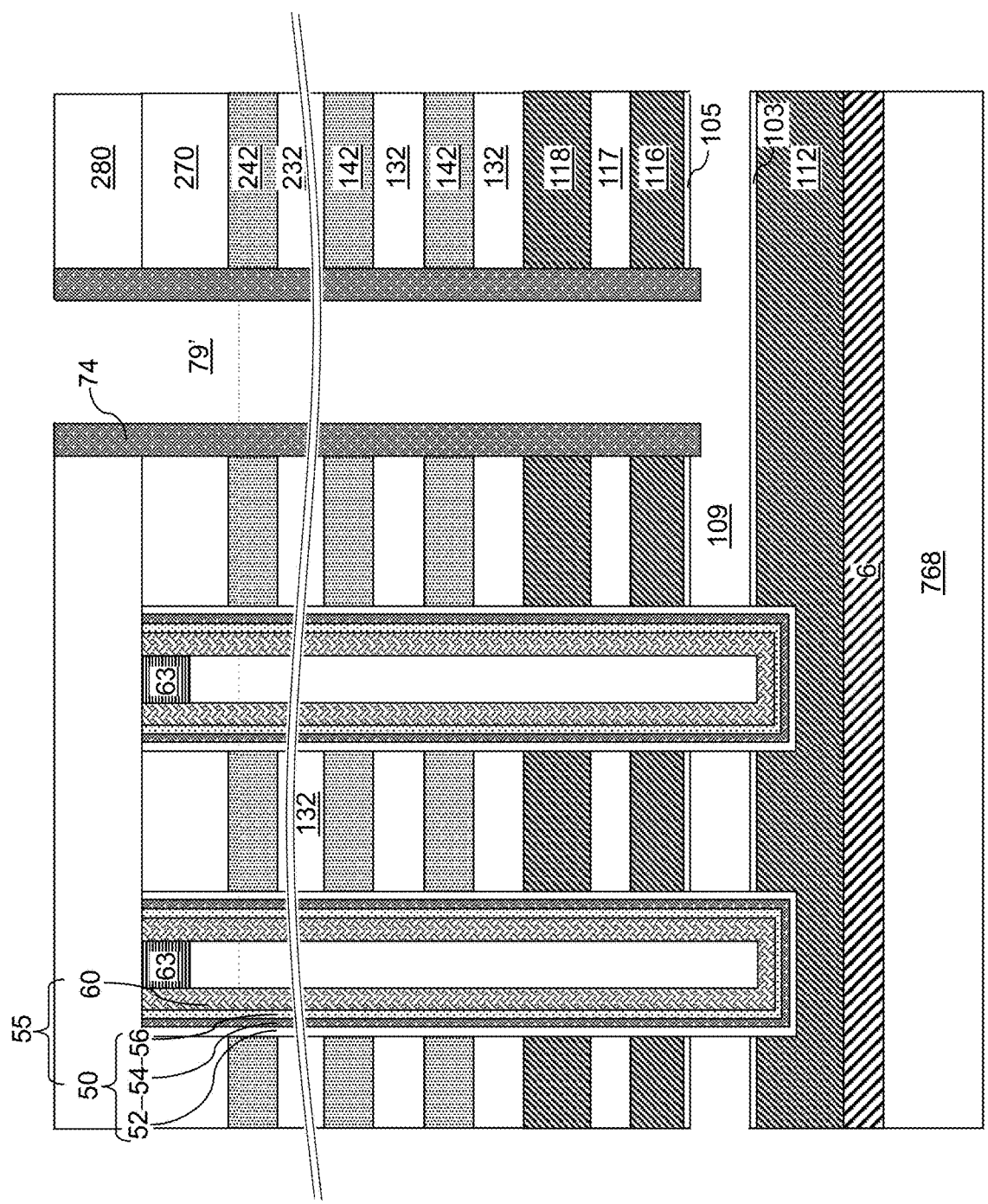

Referring to FIG. 15B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Each of the memory opening fill structures 58 is physically exposed to the source cavity 109. Specifically, each of the memory opening fill structures 58 includes a sidewall and that are physically exposed to the source cavity 109.

Figure 15C:
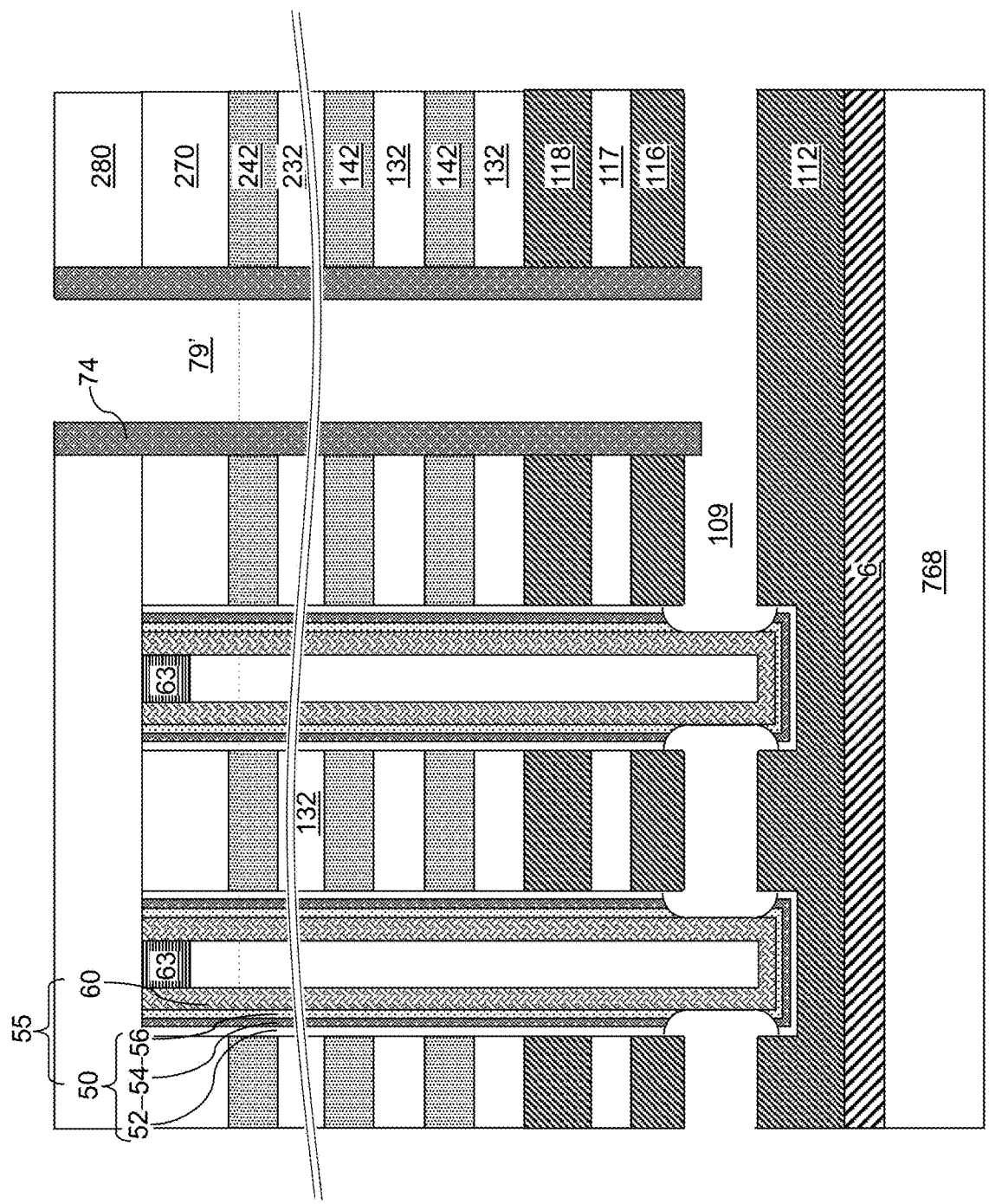

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15D:
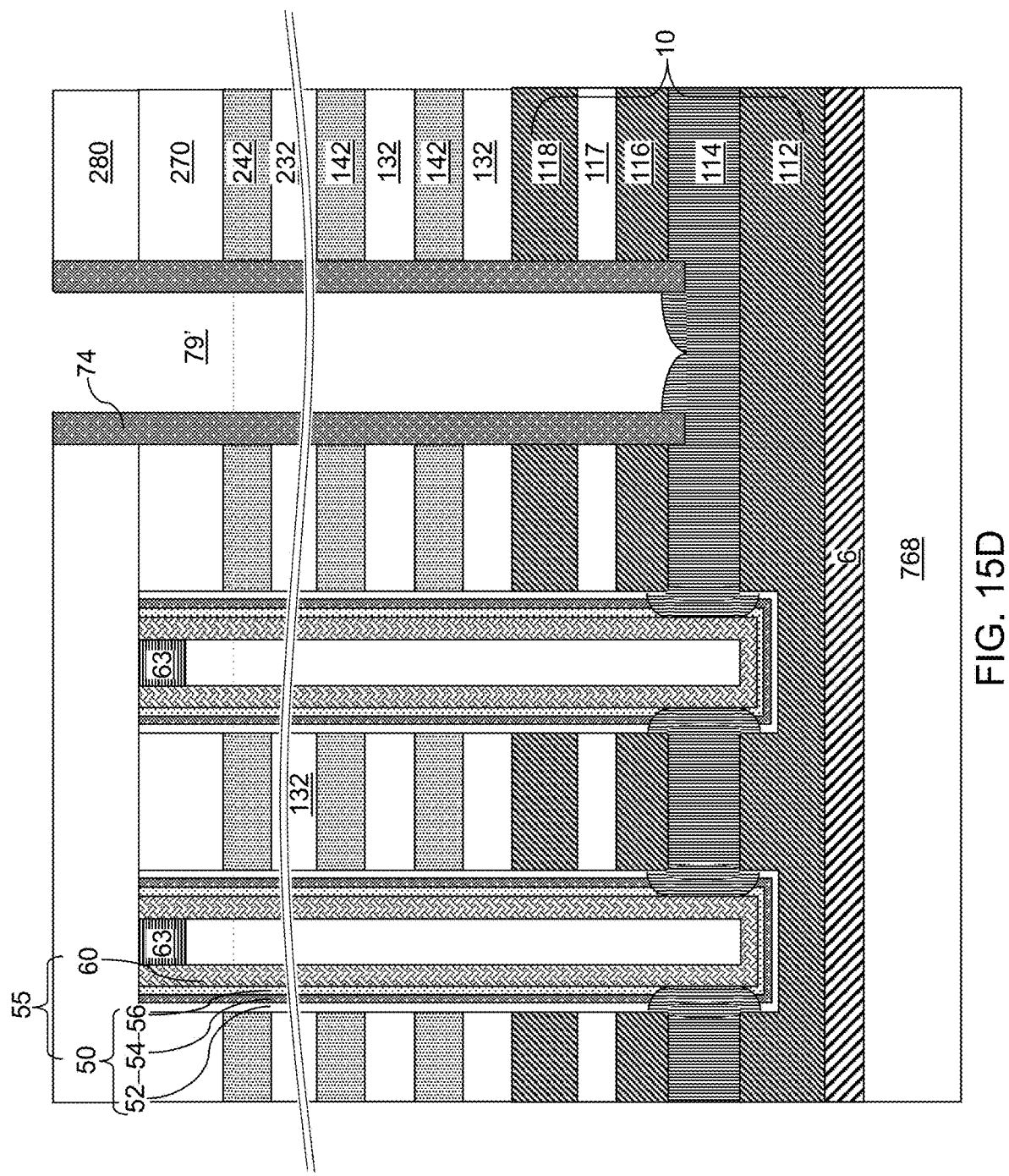

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112).

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, or stibine for n-type doped silicon material, or diborane for p-type doped silicon material. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 74. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 10, which replaces the in-process source-level material layers 10'.

Figure 15E:
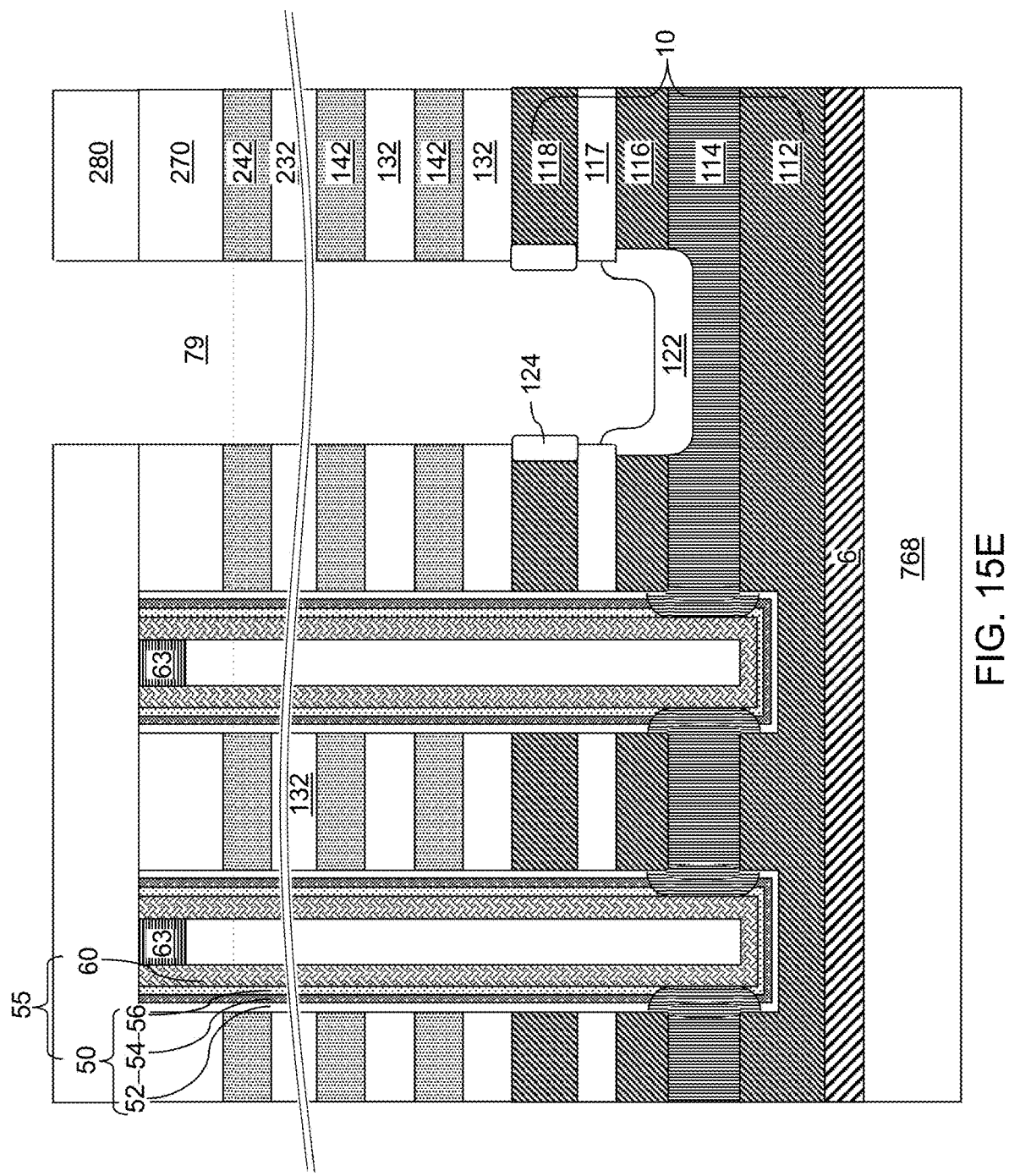
Figure 16:
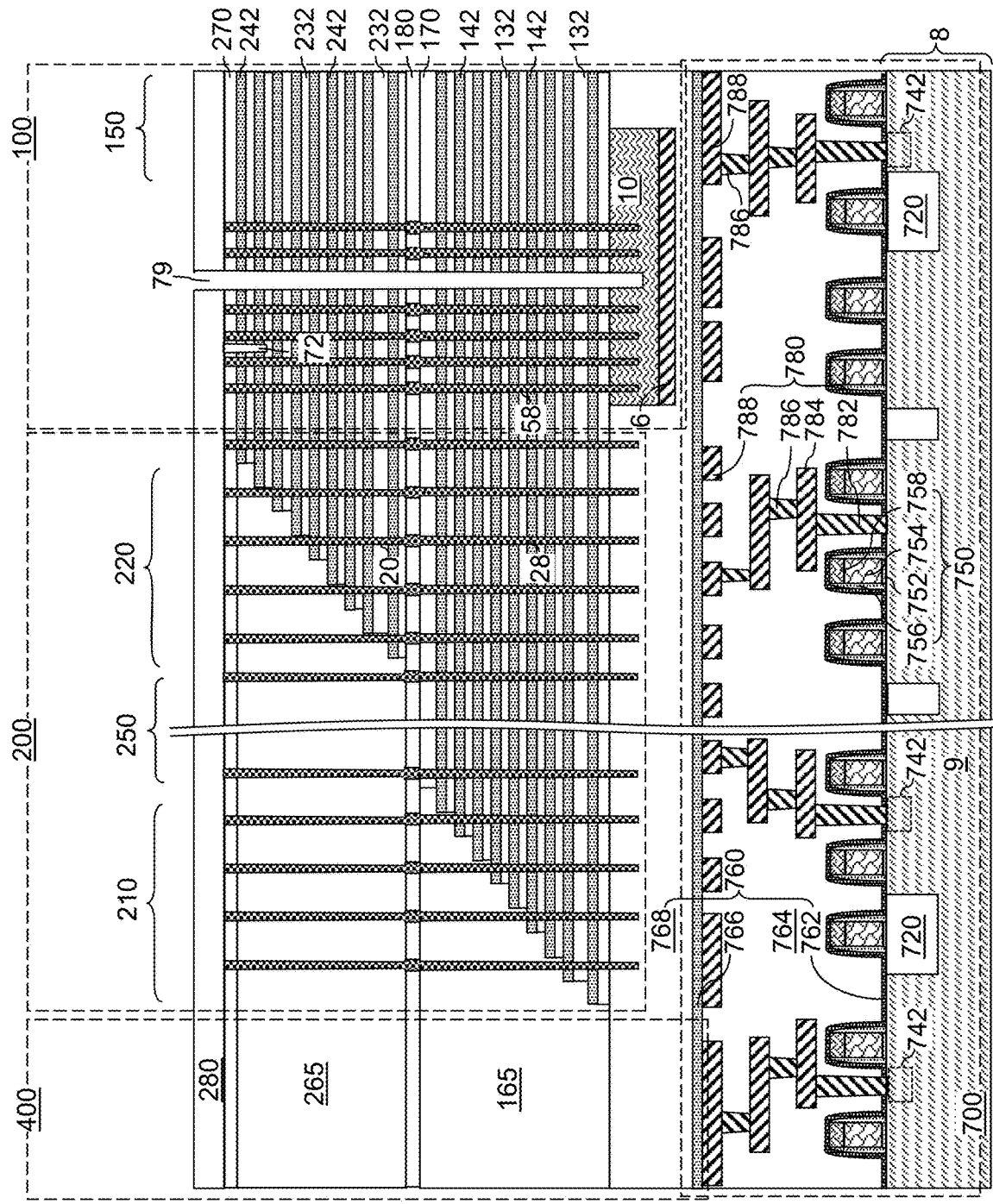
FIG. 16 is a vertical cross-sectional view of the exemplary structure after formation of source-level material layers according to an embodiment of the present disclosure.

Referring to FIGS. 15E and 16, the backside trench spacers 74 may be removed selective to the insulating layers (132, 232), the first and second insulating cap layers (170, 270), the first contact level dielectric layer 280, and the source contact layer 114 using an isotropic etch process. For example, if the backside trench spacers 74 include silicon nitride, a wet etch process using hot phosphoric acid may be performed to remove the backside trench spacers 74. In one embodiment, the isotropic etch process that removes the backside trench spacers 74 may be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 17:
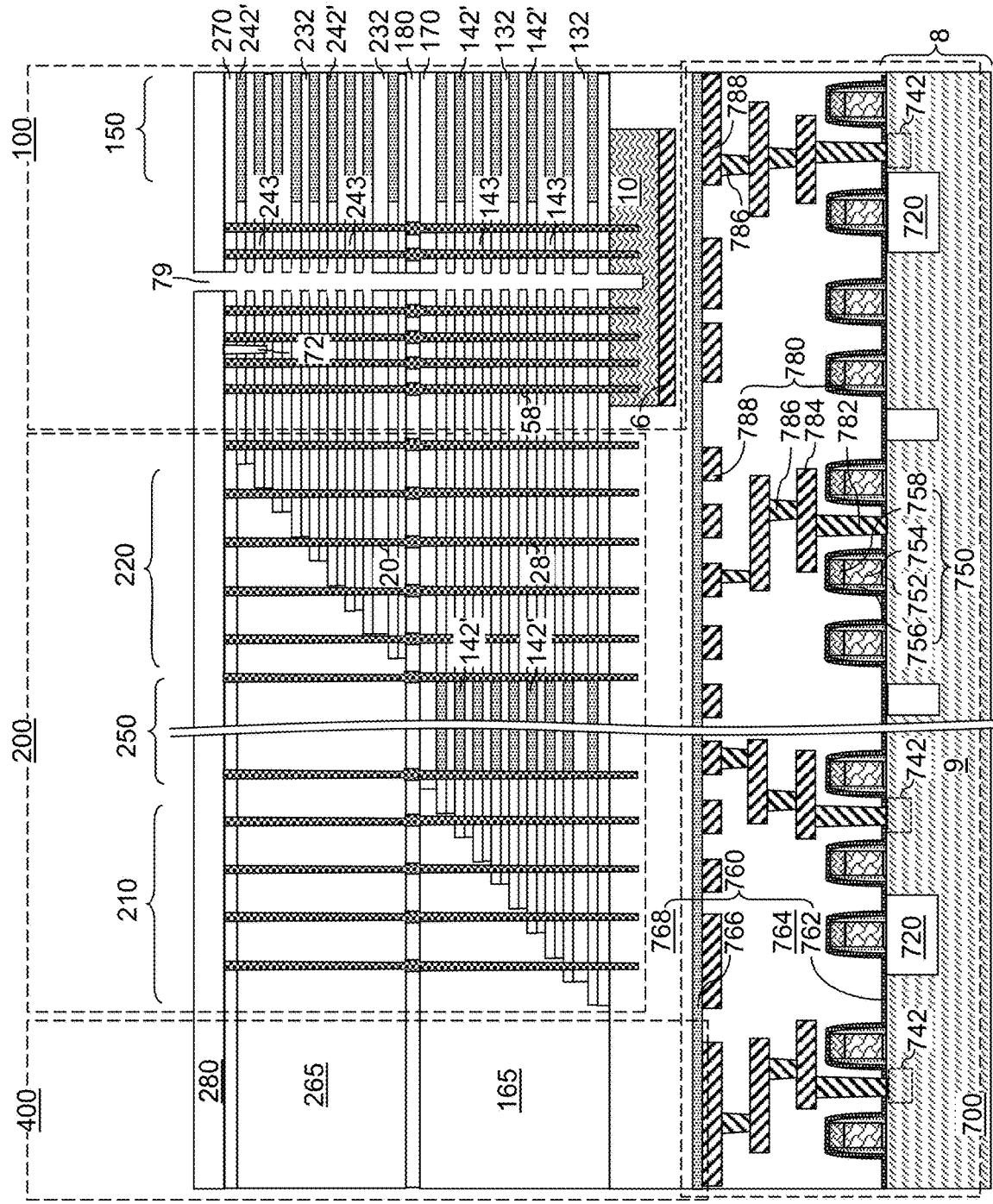
FIG. 17 is a vertical cross-sectional view of the exemplary structure after formation of backside recesses and dielectric material plates according to an embodiment of the present disclosure.
Figure 18:
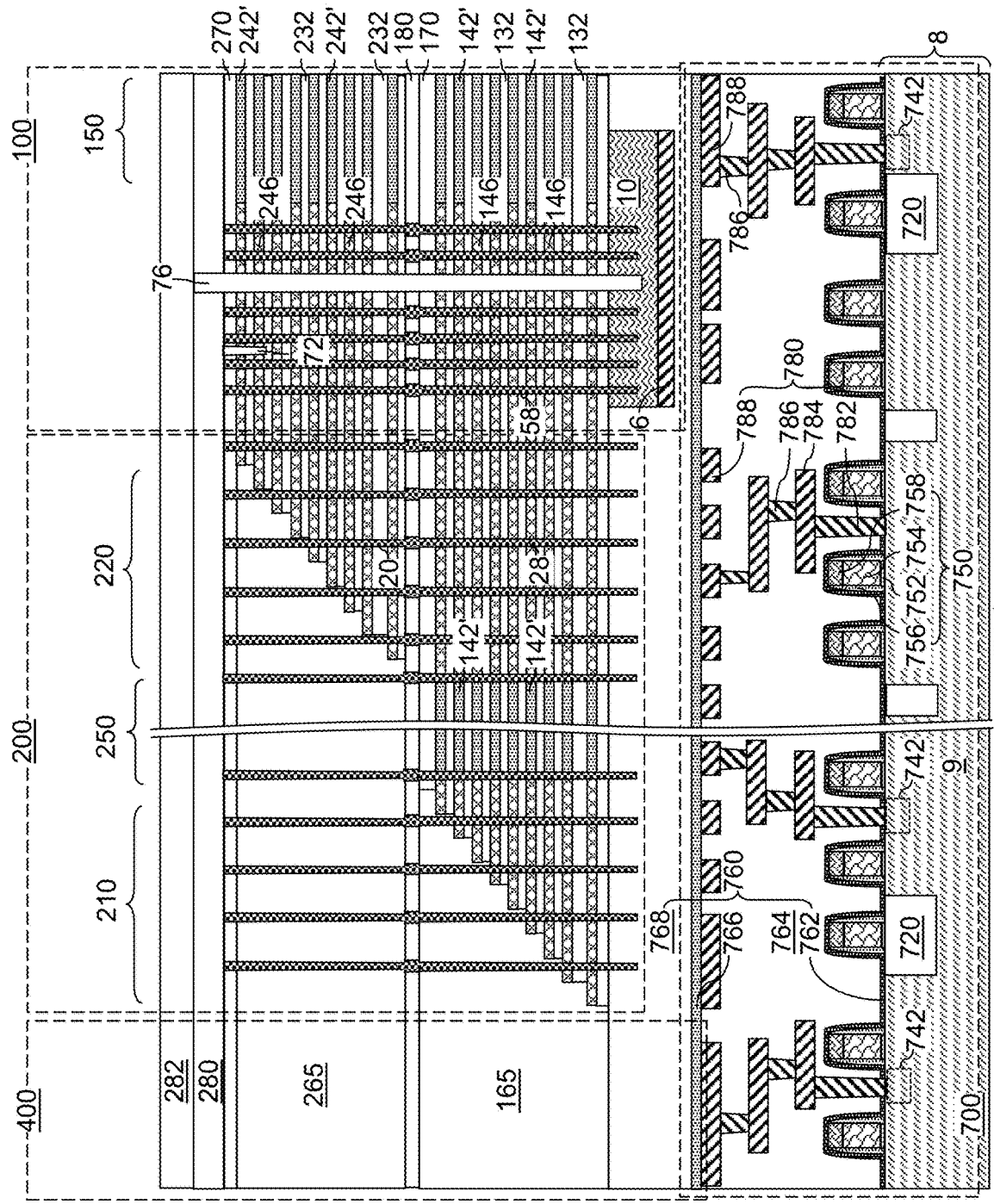
FIG. 18 is a vertical cross-sectional view of the exemplary structure after formation of electrically conductive layers and backside trench fill structures according to an embodiment of the present disclosure.
Figures 19A, 19B:
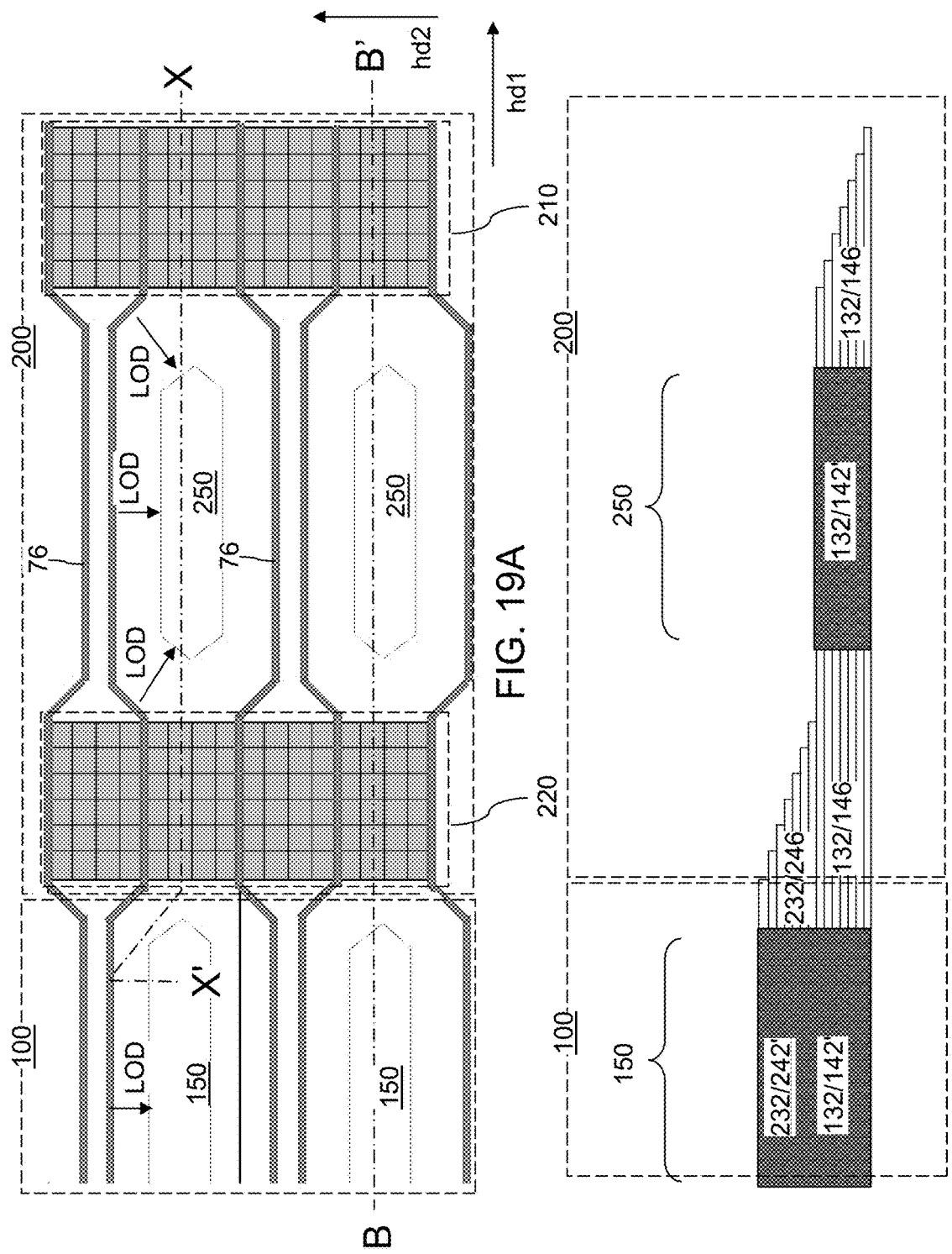
FIG. 19A is a top-down view of a first configuration of the exemplary structure at the processing steps of FIG. 18. The vertical plane X-X' corresponds to the plane of the vertical cross-sectional view of FIG. 18.
FIG. 19B is a schematic vertical cross-sectional view of the first configuration of the exemplary structure along the vertical plane B-B' of FIG. 19A.
Figure 20A:
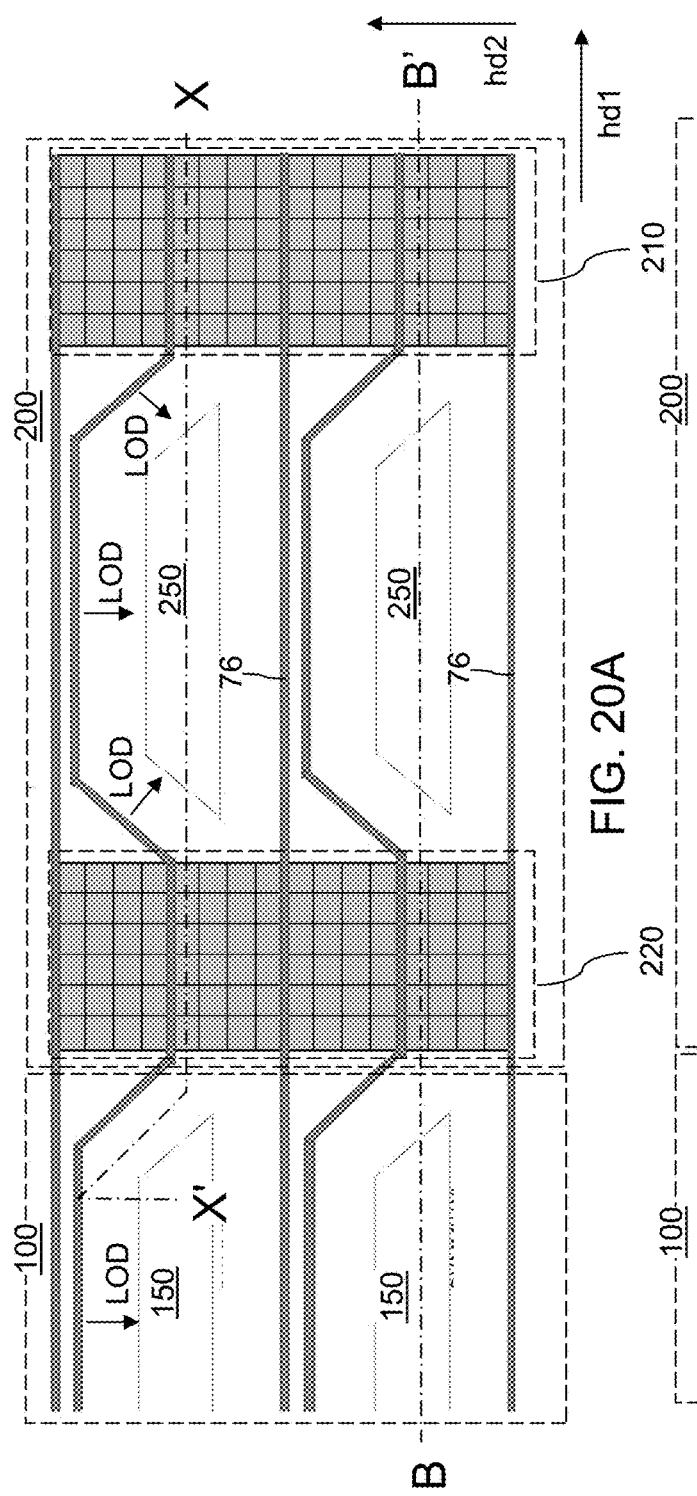
FIG. 20A is a top-down view of a second configuration of the exemplary structure at the processing steps of FIG. 18. The vertical plane X-X' corresponds to the plane of the vertical cross-sectional view of FIG. 18.
Figure 20B:
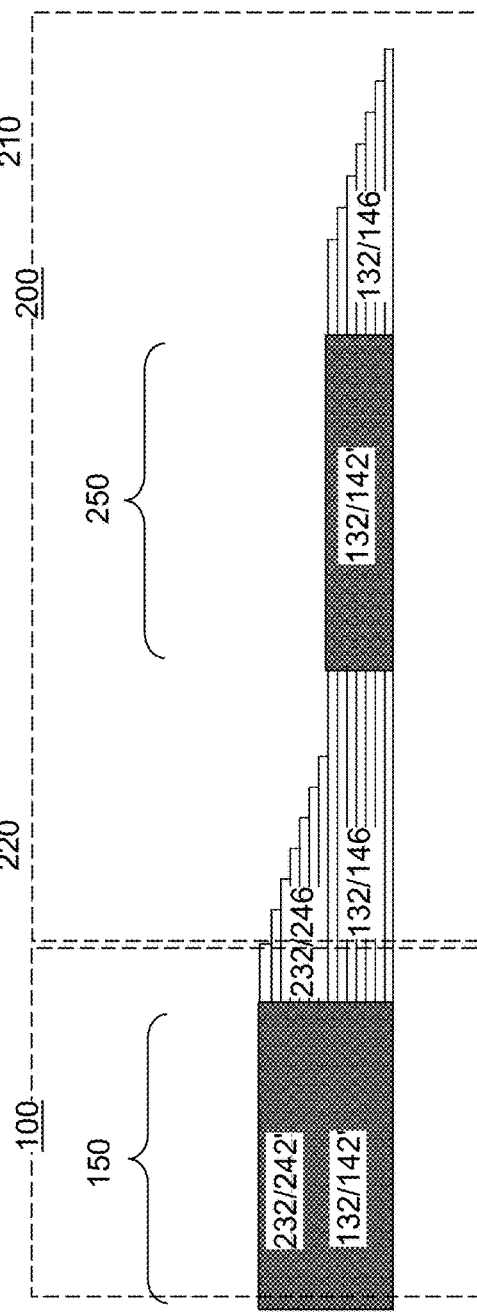
FIG. 20B is a schematic vertical cross-sectional view of the second configuration of the exemplary structure along the vertical plane B-B' of FIG. 20A.
Figure 21A:
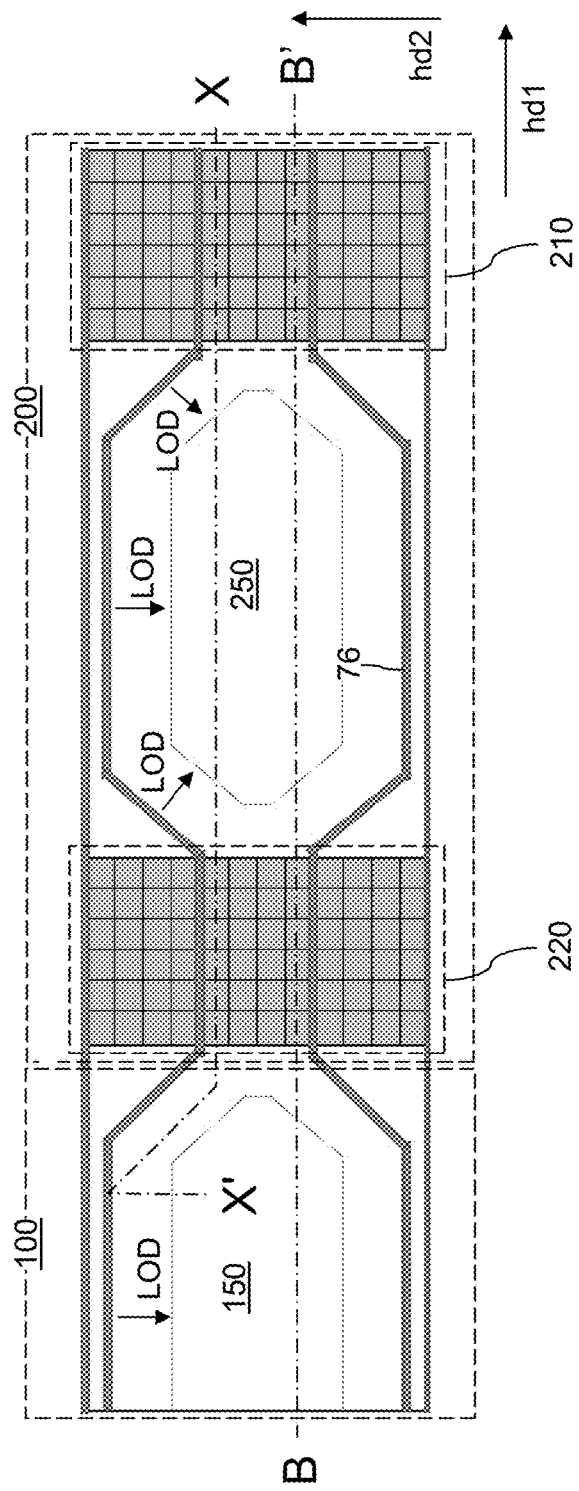
FIG. 21A is a top-down view of a third configuration of the exemplary structure at the processing steps of FIG. 18. The vertical plane X-X' corresponds to the plane of the vertical cross-sectional view of FIG. 18.
Figure 21B:
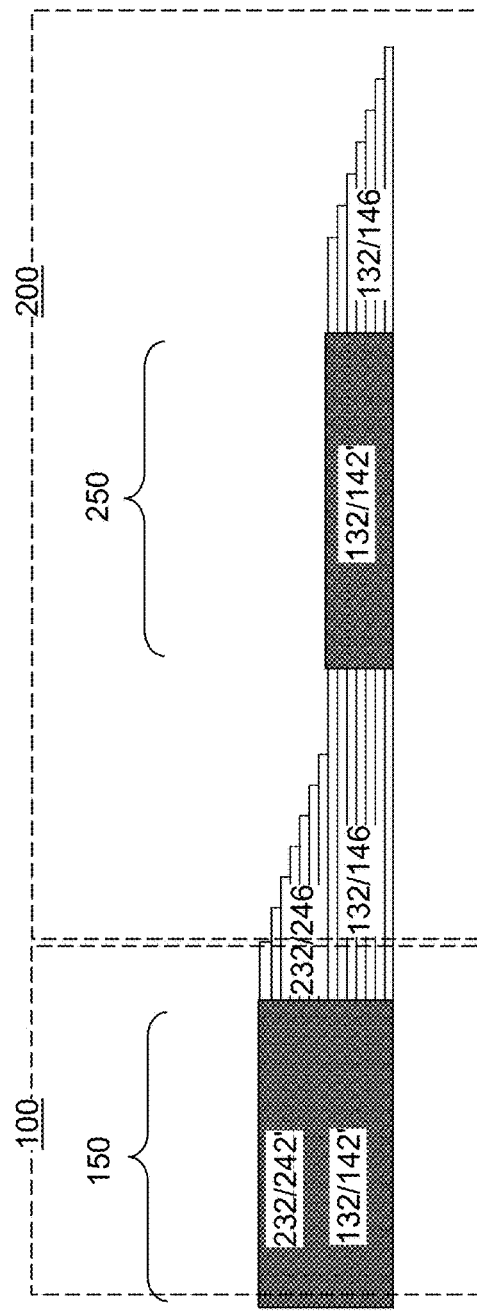
FIG. 21B is a schematic vertical cross-sectional view of the third configuration of the exemplary structure along the vertical plane B-B' of FIG. 21A.

Referring to FIG. 17, the sacrificial material layers (142, 242) are removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

According to an aspect of the present disclosure, the duration of the isotropic etch process can be selected such that the sacrificial material layers (142, 242) are not removed in the dielectric isolation regions (150, 250), but are removed outside of the dielectric isolation regions (150, 250). For example, the duration of the isotropic etch process can be selected such that the lateral etch distance of the isotropic etch process is the same as, or substantially the same as, the target lateral separation distance between each of the dielectric isolation regions (150, 250) and a respective set of most proximal backside trenches 79. The lateral etch distance can be greater than one half of a lateral separation distance between the first backside trench segments 791 of the first backside trench 79A and a most proximate second backside trench 79B. The lateral etch distance can be greater than one half of the width each contiguous set of first staircase rows 212 that provides horizontal surfaces for each first sacrificial material layer 142 in the first alternating stack (132, 142) or for each first insulating layer 132 in the first alternating stack (132, 142) along the second horizontal direction hd2, and can be greater than one half of the width of each contiguous set of second staircase rows 222 that provides horizontal surfaces for each second sacrificial material layer 242 in the second alternating stack (232, 242) or for each second insulating layer 232 in the second alternating stack (232, 242) along the second horizontal direction hd2.

Backside recesses (143, 243) are formed in volumes from which the sacrificial material layers (142, 242) are removed outside of the dielectric isolation regions (150, 250). The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, backside recesses (143, 243) are formed by isotropically laterally recessing proximal portions of the sacrificial material layers (142, 242) that are located within a uniform lateral offset distance from the backside trenches 79. Remaining portions of the sacrificial material layers (142, 242) constitute dielectric material plates (142', 242'). The dielectric material plates (142', 242') include first dielectric material plates 142' that are remaining portions of the first sacrificial material layers 142 and second dielectric material plates 142' that are remaining portions of the second sacrificial material layers 242.

A vertical stack of dielectric material plates (142', 242') is formed within a respective one of the dielectric isolation regions (150, 250). In one embodiment, a vertical stack of dielectric material plates 142' consisting of first dielectric material plates 142' can be formed within each of the staircase dielectric isolation regions 250. A vertical stack of dielectric material plates (142', 242') including first dielectric material plates 142' and second dielectric material plates 242' can be formed within each of the array dielectric isolation regions 150. Sidewalls of each vertical stack the dielectric material plates (142', 242') can be laterally spaced from a respective set of most proximal portions of the backside trenches 79 by a uniform lateral offset distance, which is the lateral etch distance of the isotropic etch process that forms the backside trenches 79.

Referring to FIGS. 18, 19A and 19B, 20A and 20B, and 21A and 21B, a backside blocking dielectric layer (not shown) may be optionally deposited in the backside recesses (143, 243) and the backside trenches 79 and over the first contact level dielectric layer 280. FIGS. 19A and 19B, 20A and 20B, and 21A and 21B illustrate the first configuration, the second configuration, and the third configuration of the exemplary structure at the processing steps of FIG. 18, respectively. The hinged vertical cross-sectional planes X-X' in each of FIGS. 19A, 20A, and 21A correspond to the plane of the vertical cross-sectional view of FIG. 18. The vertical cross-sectional planes B-B' in each of FIGS. 19A, 20A, and 21A correspond to the planes of the vertical cross-sectional views of FIGS. 19B, 20B, and 21B, respectively.

The backside blocking dielectric layer can be formed on sidewalls of the dielectric material plates (142', 242') in the dielectric isolation regions (150, 250) and on physically exposed surfaces of the insulating layers (132, 232). The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces 220. Each electrically conductive layer (146, 246) may have a greater area than any overlying electrically conductive layer (146, 246) because of the first and second stepped surfaces 220.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

A dielectric material layer may be conformally deposited in the backside trenches 79 and over the first contact level dielectric layer 280 by a conformal deposition process. The dielectric material layer may include, for example, silicon oxide. The horizontal portion of the dielectric material layer overlying the first contact level dielectric layer 280 may constitute a second contact level dielectric layer 282. Each portion of the dielectric material layer filling a backside trench constitutes a backside trench fill structure 76.

Each contiguous combination of an electrically conductive layer (146, 246), a continuous portion of an optional blocking dielectric layer (if included) and at least one dielectric material plate (142', 242') located in a respective dielectric isolation region (150, 250) constitutes a multipart layer {(146, 142') or (246, 242')} located between a neighboring pair of backside trenches 79. The sacrificial material layers (142, 242) in a plurality of alternating stacks (132, 142, 232, 242) are replaced with the multipart layers {(146, 142') or (246, 242')} by partially replacing the sacrificial material layers (142, 242) with the electrically conductive layers (146, 246). Each dielectric material plate (142', 242') is a remaining portion of a respective sacrificial material layer (142, 242). Each multipart layer includes at least one dielectric material plate (142', 242') that is laterally enclosed by a respective electrically conductive layer (146, 246), and is laterally spaced from a most proximal one of the backside trenches 79 by a uniform lateral offset distance LOD.

Generally, alternating stacks of insulating layers (132, 232) and multipart layers {(146, 142'), (246, 242')} are located over a substrate 8. Each neighboring pair of alternating stacks {(132, 232, 146, 142', 246, 242') or (132, 232, 146, 246)} is laterally spaced apart from each other by a respective backside trench 79. Each of the multipart layers comprises a respective electrically conductive layer (146, 246) that laterally extends continuously between a respective neighboring pair of backside trenches 79 and at least one dielectric material plate (142', 242') that is laterally enclosed by the respective electrically conductive layer (146, 246) and is laterally spaced from the respective neighboring pair of backside trenches 79 by a uniform lateral offset distance LOD. Memory stack structures 55 vertically extending through a respective one of the alternating stacks {(132, 232, 146, 142', 246, 242') or (132, 232, 146, 246)}. Each memory stack structure 55 comprises a respective vertical semiconductor channel 60 and a memory film 50.

In one embodiment, the respective neighboring pair of backside trenches 79 extends along a first horizontal direction hd1 with a modulation in a lateral separation distance along a second horizontal direction hd2 therebetween. The second horizontal direction hd2 is perpendicular to the first horizontal direction hd1.

In one embodiment, each sidewall of the dielectric material plates (142', 242') is laterally spaced from a most proximal one of the backside trenches 79 by the uniform lateral offset distance LOD.

In one embodiment, a subset of the dielectric material plates 142' is located within a staircase region 200 (e.g., in region 230) between first stepped surfaces 210 and second stepped surfaces 220 that are laterally spaced apart along the first horizontal direction hd1. In one embodiment, all sidewalls of dielectric material plates 142' within the subset of the dielectric material plates 142' are vertically coincident with each other another. In one embodiment, each dielectric material plate 142' within the subset of the dielectric material plates 142' has a horizontal cross-sectional shape of a trapezoid having a pair of parallel sides of unequal lengths adjoined to a pair of non-parallel sides. In one embodiment shown in FIG. 20A, the pair of parallel sides of unequal lengths can be parallel to the first horizontal direction hd1. In another embodiment shown in FIGS. 19A and 21A, each dielectric material plate 142' within the subset of the dielectric material plates 142' has a horizontal cross-sectional shape of a polygon having at least six sides (such as a hexagon shown in FIG. 19A or an octagon shown in FIG. 21A).

The staircase region 200 comprises first stepped surfaces 210 and second stepped surfaces 220 that are laterally spaced apart by region 230 along the first horizontal direction hd1. The subset of the dielectric material plates (142', 242') is formed in the region 230 located between the first staircase region 210 and the second staircase region 220. The area inside region 230 containing the subset of the dielectric material plates (142', 242') is referred to as a staircase dielectric isolation region 250.

Figure 22:
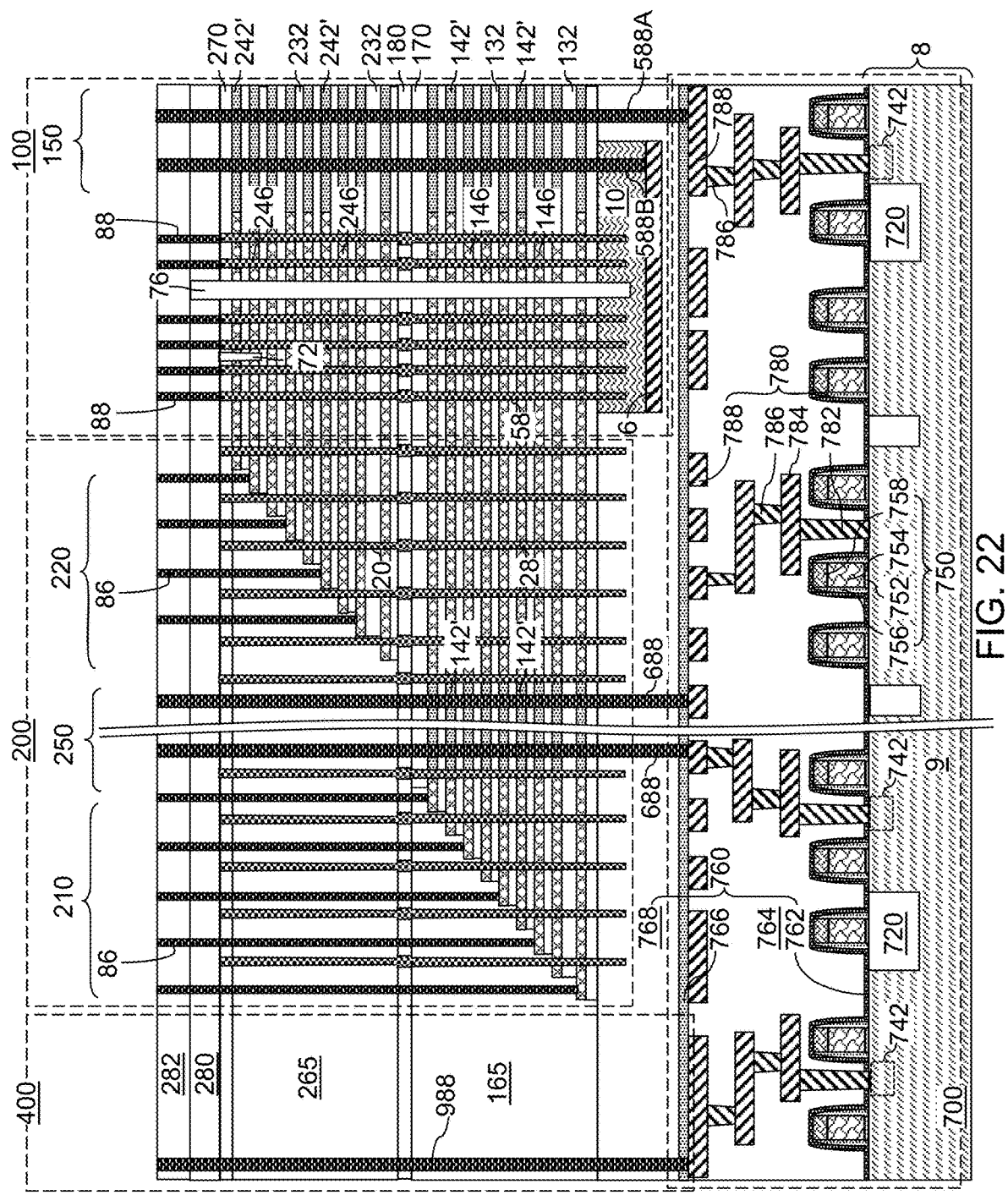
FIG. 22 is a vertical cross-sectional view of the exemplary structure after formation of a second contact level dielectric layer and various contact via structures and connection via structures according to an embodiment of the present disclosure.
Figure 23:
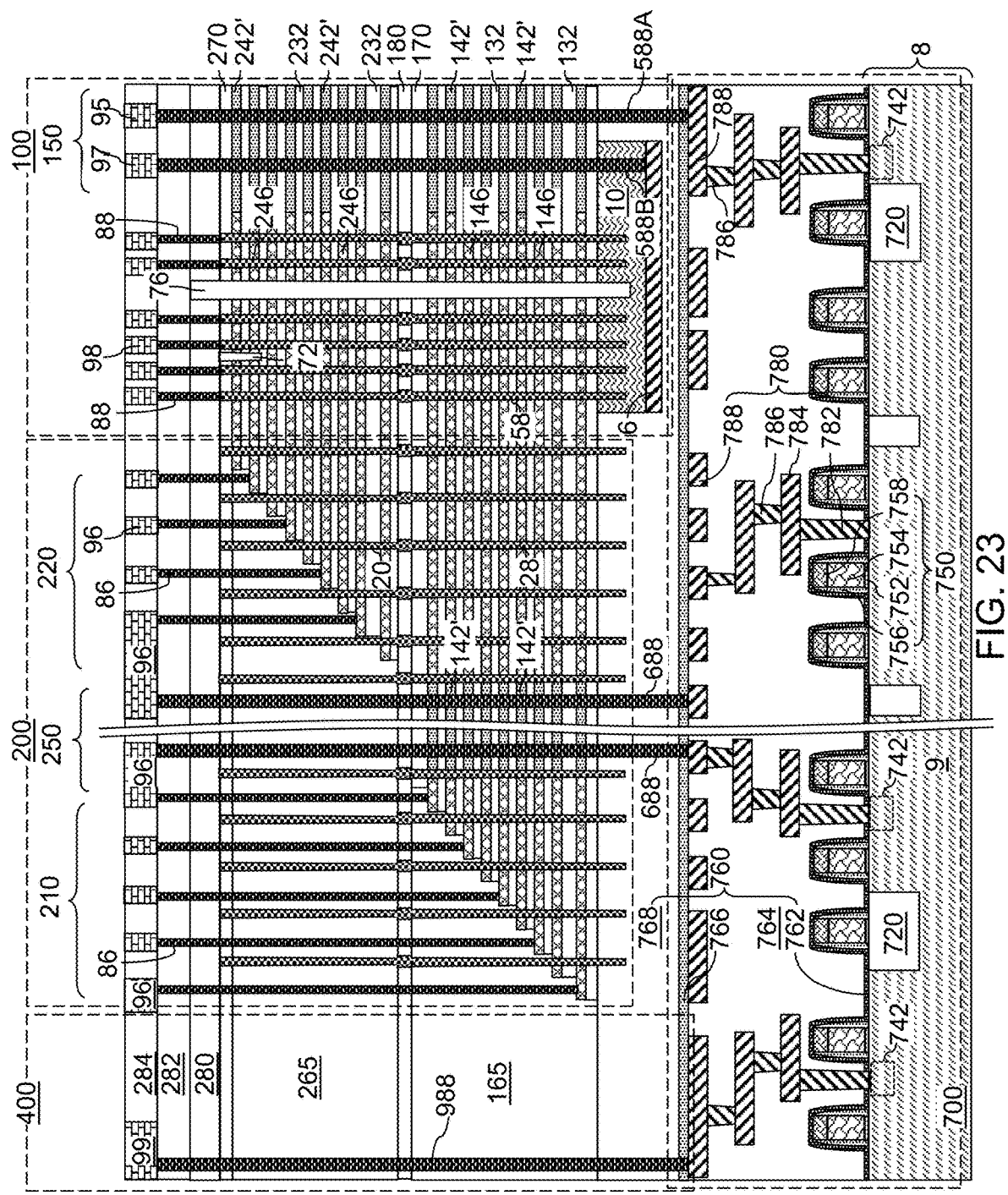
FIG. 23 is a vertical cross-sectional view of the exemplary structure after formation of upper-level metal line structures according to an embodiment of the present disclosure.
Figure 25A:
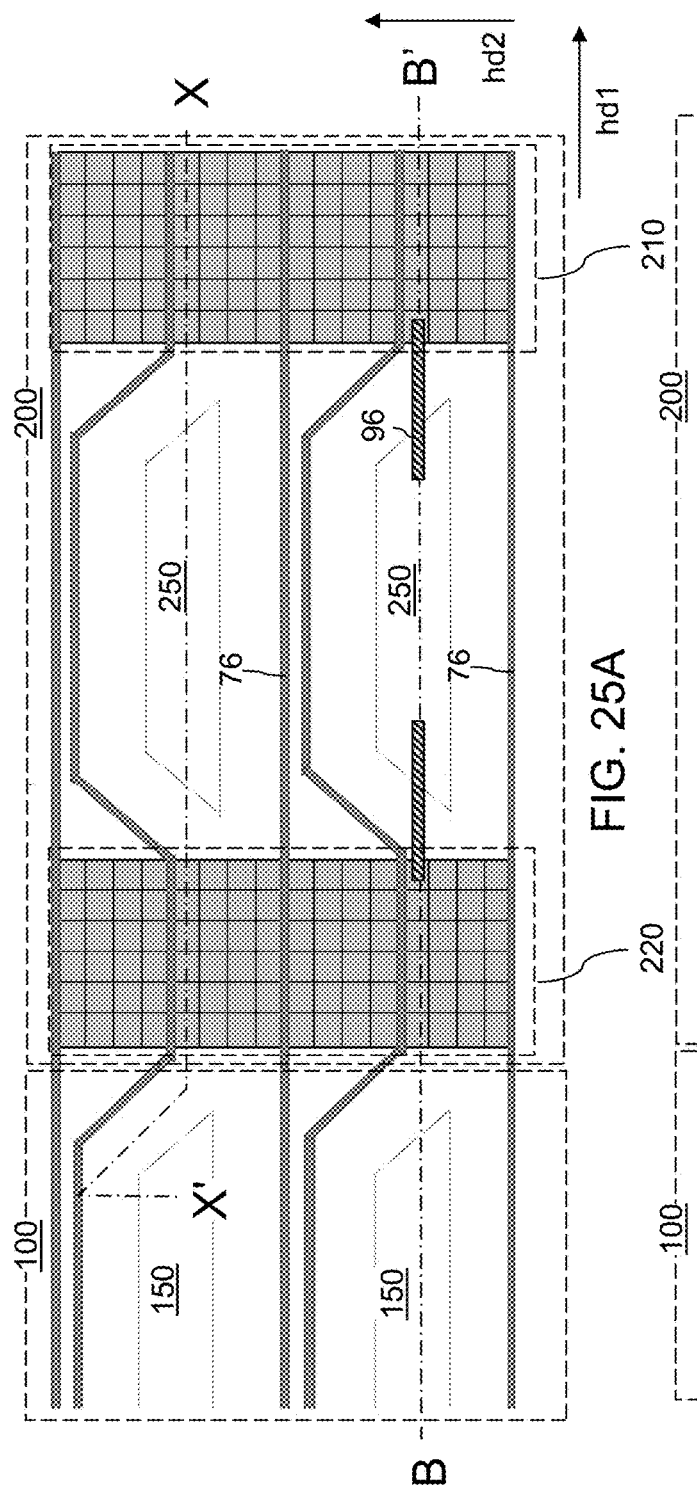
FIG. 25A is a top-down view of a second configuration of the exemplary structure at the processing steps of FIG. 23. The vertical plane X-X' corresponds to the plane of the vertical cross-sectional view of FIG. 23.
Figure 25B:
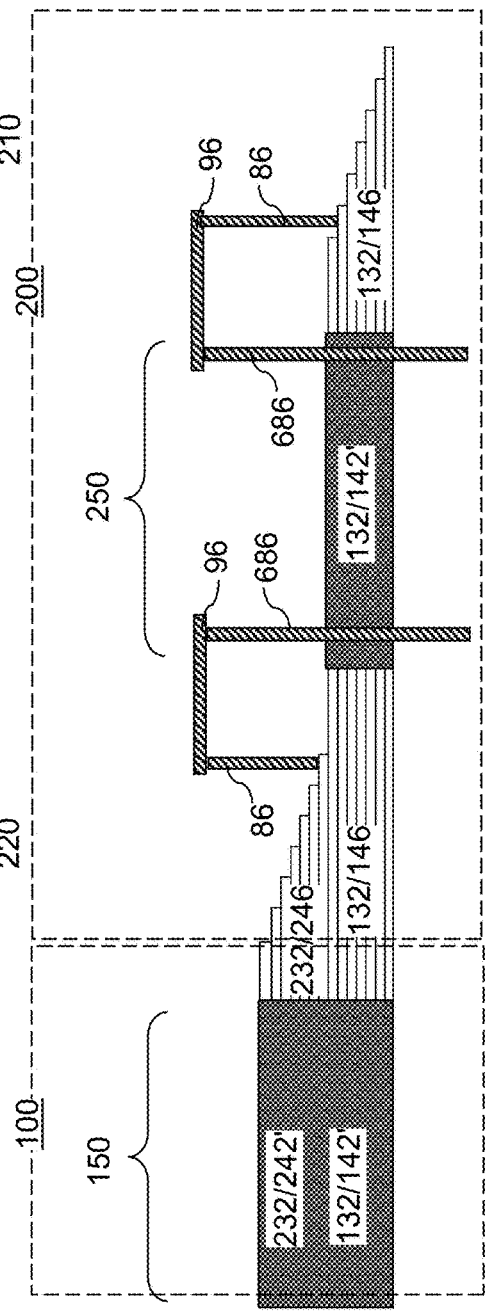
FIG. 25B is a schematic vertical cross-sectional view of the second configuration of the exemplary structure along the vertical plane B-B' of FIG. 25A.

Referring to FIG. 22, a photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. Opening for forming connection via structures can be formed in the staircase dielectric isolation regions 250 and optionally in the array dielectric isolation regions 150.

An anisotropic etch process is performed to transfer the pattern in the photoresist layer through the second and first contact level dielectric layers (282, 280) and underlying dielectric material portions. The drain regions 63, the electrically conductive layers (146, 246), the landing-pad-level metal line structures 788, and the optional conductive plate layer 6 or the source contact layer 114 may be employed as etch stop structures during the anisotropic etch process. Various via cavities are formed underneath the openings in the photoresist layer. The various via cavities can include drain contact via cavities formed directly on the drain regions 63, staircase-region contact via structures formed directly on the electrically conductive layers (146, 246), first connection via cavities formed in the array dielectric isolation regions 150 through a respective set of dielectric material plates (142', 242') and directly on a first subset of the landing-pad-level metal line structures 788, source contact via cavities formed in the array dielectric isolation regions 150 through a respective set of dielectric material plates (142', 242') and directly on the conductive plate layer 6 or on one of the source-level material layers 10, second connection via cavities formed in the staircase dielectric isolation regions 250 through a respective set of dielectric material plates 142' and directly on a second subset of the landing-pad-level metal line structures 788, and optionally peripheral connection via cavities formed through the second and first retro-stepped dielectric material portions (265, 165) in the peripheral device region 400. The photoresist layer can be subsequently removed, for example, by ashing.

In an alternative embodiment, multiple photoresist layers and multiple anisotropic etch processes can be employed in lieu of a single photoresist layer and a single anisotropic etch process to form the various via cavities at different processing steps.

At least one conductive material can be deposited in the via cavities directly on the various underlying conductive material portions. The at least one conductive material can include a metallic liner material (such as TiN, TaN, or WN) and a metallic fill material (such as W, Cu, Mo, Co, Ru, or an alloy thereof).

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

First connection via structures 588A are formed in the first connection via cavities located in in the array dielectric isolation regions 150. Each first connection via structure 588A vertically extends through a respective vertical stack of insulating layers (132, 232) and dielectric material plates (142', 242') and directly on a respective landing-pad-level metal line structure 788 within the first subset of the landing-pad-level metal line structures 788 that underlie the memory array region 100. Source contact via structures 588B are formed in the source contact via cavities in the array dielectric isolation regions 150. The source contact via structures 588B are formed through a respective vertical stack of insulating layers (132, 232) and dielectric material plates (142', 242') and directly on the conductive plate layer 6 or on one of the source-level material layers 10. Second connection via structures 688 can be formed in the second connection via cavities in the staircase dielectric isolation regions 250. The second connection via structures 688 can be formed through the second retro-stepped dielectric material portion 265 and through an alternating stack of first insulating layers 132 and first dielectric material plates 142' and directly on a respective landing-pad-level metal line structure 788 within the second subset of the landing-pad-level metal line structures 788 that underlie the staircase region 200. Peripheral connection via structures 988 can be formed in the peripheral connection via cavities through the second retro-stepped dielectric material portion 265 and the first retro-stepped dielectric material portion 165 and directly on a respective landing-pad-level metal line structure 788 within a third subset of the landing-pad-level metal line structures 788 that underlie the peripheral device region 400.

Referring to FIGS. 23, 24A and 24B, 25A and 25B, and 26A and 26B, at least one additional dielectric layer may be formed over the contact level dielectric layers (280, 282), and additional metal interconnect structures (herein referred to as upper-level metal interconnect structures) may be formed in the at least one additional dielectric layer. FIGS. 24A and 24B, 25A and 25B, and 26A and 26B illustrate the first configuration, the second configuration, and the third configuration of the exemplary structure at the processing steps of FIG. 23, respectively. The hinged vertical cross-sectional planes X-X' in each of FIGS. 24A, 25A, and 26A correspond to the plane of the vertical cross-sectional view of FIG. 23. The vertical cross-sectional planes B-B' in each of FIGS. 24A, 25A, and 26A correspond to the planes of the vertical cross-sectional views of FIGS. 24B, 25B, and 26B, respectively.

The at least one additional dielectric layer may include a line-level dielectric layer 290 that is formed over the contact level dielectric layers (280, 282). The upper-level metal interconnect structures may include bit lines 98 contacting a respective one of the drain contact via structures 88. The upper-level metal interconnect structures may include first interconnection line structures 95 contacting a respective one of the first connection via structures 588A. The upper-level metal interconnect structures may include source connection line structures 97 contacting or a respective one of the source contact via structures 588B. The upper-level metal interconnect structures may include second interconnection line structures 96 contacting, and/or electrically connected to, at least one of the staircase-region contact via structures 86 and/or the second connection via structures 688. The word line contact via structures (which are provided as a subset of the staircase-region contact via structures 86) may be electrically connected to the word line driver circuit semiconductor devices 710 in the peripheral device region 700 through a subset of the lower-level metal interconnect structures 780 and through a subset of the second connection via structures 688. The upper-level metal interconnect structures may include peripheral connection line structures 99 contacting a respective one of the peripheral interconnection via structures 988.

Referring to all drawings and according to various embodiments of the present disclosure, a three-dimensional memory device is provided, which comprises: alternating stacks of insulating layers (132, 232) and multipart layers {(146, 142'), (246, 242')} located over a substrate 8, wherein each neighboring pair of alternating stacks {(132, 232), (146, 142'), (246, 242')} is laterally spaced apart from each other by at least one backside trench, wherein each of the multipart layers {(146, 142'), (246, 242')} comprises a respective electrically conductive layer (146, 246) that laterally extends continuously between a respective neighboring pair of backside trenches 79 and at least one dielectric material plate (142', 242') that is laterally enclosed by the respective electrically conductive layer (146, 246) and is laterally spaced from the respective neighboring pair of backside trenches 79 by a uniform lateral offset distance LOD, memory stack structures 55 vertically extending through a respective one of the alternating stacks {(132, 232), (146, 142'), (246, 242')} and comprising a respective vertical semiconductor channel 60 and a memory film 50, and a connection via structure 688 vertically extending through a vertical stack of dielectric material plates 142' and insulating layers 132 within a respective one of the alternating stacks {(132, 232), (146, 142'), (246, 242')}.

In one embodiment, the respective neighboring pair of backside trenches 79 generally extends along a first horizontal direction hd1 with a modulation in a lateral separation distance along a second horizontal direction hd2 therebetween, the second horizontal direction hd2 being perpendicular to the first horizontal direction hd1.

In one embodiment, each sidewall of the dielectric material plates (142', 242') is laterally spaced from a most proximal one of the backside trenches 79 by the uniform lateral offset distance LOD, and directly contacts a sidewall the electrically conductive layer (146, 246) in the same multipart layer {(146, 142'), (246, 242')}, such that a dielectric liner or border between the electrically conductive layer and the dielectric material plate in the same multipart layer may be omitted.

In one embodiment, a subset of the dielectric material plates 142' is located within a staircase region 200 between first stepped surfaces 210 and second stepped surfaces 220 that are laterally spaced apart along the first horizontal direction hd1. In one embodiment, all sidewalls of dielectric material plates 142' within the subset of the dielectric material plates 142' are vertically coincident to each other.

In one embodiment, each dielectric material plate 142' within the subset of the dielectric material plates 142' has a horizontal cross-sectional shape of a trapezoid having a pair of parallel sides of unequal lengths adjoined to a pair of non-parallel sides. In one embodiment, each dielectric material plate 142' within the subset of the dielectric material plates 142' has a horizontal cross-sectional shape of a polygon having at least six sides.

In one embodiment illustrated in FIGS. 11A, 12A and 13A, a neighboring pair of backside trenches 79 comprises a first backside trench 79A that includes: first backside trench segments 791 that are centered around a first vertical plane VP1 extending along the first horizontal direction hd1 and are laterally spaced apart along the first horizontal direction hd1; second backside trench segments 792 that are laterally offset from the first vertical plane VP1 along a second horizontal direction hd2 that is perpendicular to the first horizontal direction hd1; and connection backside trench segments 798 that connect the second backside trench segments 792 to a respective one of the first backside trench segments 791. In one embodiment, each of the connection backside trench segments 798 laterally extends along a respective horizontal direction that is at an angle in a range from 15 degrees to 90 degrees with respect to the first horizontal direction hd1.

In one embodiment illustrated in FIG. 11A, the neighboring pair of backside trenches 79 comprises a second backside trench 79B that includes: third backside trench segments 793 that are centered around a second vertical plane VP2 extending along the first horizontal direction hd1 and are laterally spaced apart along the first horizontal direction hd1; a fourth backside trench segment 794 that is laterally offset from the second vertical plane VP2 along the second horizontal direction hd2; and additional connection backside trench segments 798 that connect the fourth backside trench segments 794 to a respective one of the third backside trench segments 793.

In another embodiment illustrated in FIGS. 12A and 13A, the neighboring pair of backside trenches 79 comprises a second backside trench 79B that extends along the first horizontal direction hd1 throughout an entirety thereof.

In one embodiment, the three-dimensional memory device comprises: a dielectric material portion (such as the second retro-stepped dielectric material portion 265) overlying a first alternating stack {(132, 232), (146, 142'), (246, 242')} of the alternating stacks {(132, 232), (146, 142'), (246, 242')}. The connection via structure (such as a second connection via structure 688) vertically extends through the dielectric material portion 265 and through a vertical stack of dielectric material plates 142' and insulating layers 132 within the first alternating stack {(132, 232), (146, 142'), (246, 242')}.

In one embodiment, the three-dimensional memory device comprises: field effect transistors 710 overlying the substrate 8; lower-level dielectric material layers 760 overlying the field effect transistors 710 and underlying the alternating stacks {(132, 232), (146, 142'), (246, 242')} and embedding lower-level metal interconnect structures 780; contact via structures (such as the staircase-region contact via structures 86) contacting a respective electrically conductive layer (146, 246) within the first alternating stack {(132, 232), (146, 142'), (246, 242')}; and upper-level metal interconnect structures (95, 96, 97, 98, 99) overlying the dielectric material portion and contacting the contact via structures, wherein the connection via structure contacts a respective one of the lower-level metal interconnect structures 780 and a respective one of the upper-level metal interconnect structures (95, 96, 97, 98, 99).

The various connection via structures (588A, 688, 988) of the present disclosure can be employed to provide electrical connection paths between the various nodes of the three-dimensional array of memory elements overlying the source-level material layers 10 and the various semiconductor devices underlying the source-level material layers 10. The dielectric isolation regions (150, 250) provide an electrically insulated region in which the connection via structures (588A, 688, 988) can be formed without any dielectric liner or border. Each of the dielectric isolation regions (150, 250) includes a vertically alternating stack of insulating layers (132, 232) and dielectric material plates (142', 242').

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device, comprising:
alternating stacks of insulating layers and multipart layers located over a substrate, wherein each neighboring pair of alternating stacks is laterally spaced apart from each other by at least one backside trench, wherein each of the multipart layers comprises a respective electrically conductive layer that laterally extends continuously between a respective neighboring pair of backside trenches and at least one dielectric material plate that is laterally enclosed by the respective electrically conductive layer and is laterally spaced from the respective neighboring pair of backside trenches by a uniform lateral offset distance;
memory stack structures vertically extending through a respective one of the alternating stacks and comprising a respective vertical semiconductor channel and memory film; and
a connection via structure vertically extending through a dielectric material portion and through a vertical stack of dielectric material plates comprising the at least one dielectric material plate and insulating layers within the respective one of the alternating stacks,
wherein the respective neighboring pair of backside trenches generally extends along a first horizontal direction with a modulation in a lateral separation distance along a second horizontal direction therebetween, the second horizontal direction being perpendicular to the first horizontal direction.

2. The three-dimensional memory device of claim 1, wherein each sidewall of the dielectric material plates is laterally spaced from a most proximal one of the backside trenches by the uniform lateral offset distance and directly contacts a sidewall of the electrically conductive layer in the same multipart layer.

3. The three-dimensional memory device of claim 1, wherein a subset of the dielectric material plates is located within a staircase region between first stepped surfaces and second stepped surfaces that are laterally spaced apart along a first horizontal direction.

4. The three-dimensional memory device of claim 3, wherein all sidewalls of dielectric material plates within the subset of the dielectric material plates are vertically coincident to each other.

5. The three-dimensional memory device of claim 4, wherein each dielectric material plate within the subset of the dielectric material plates has a horizontal cross-sectional shape of a trapezoid having a pair of parallel sides of unequal lengths adjoined to a pair of non-parallel sides.

6. The three-dimensional memory device of claim 4, wherein each dielectric material plate within the subset of the dielectric material plates has a horizontal cross-sectional shape of a polygon having at least six sides.

7. The three-dimensional memory device of claim 1, wherein a neighboring pair of backside trenches comprises a first backside trench that includes:
   first backside trench segments that are centered around a first vertical plane extending along a first horizontal direction and that are laterally spaced apart along the first horizontal direction;
   second backside trench segments that are laterally offset from the first vertical plane along a second horizontal direction that is perpendicular to the first horizontal direction; and
   connection backside trench segments that connect the second backside trench segments to a respective one of the first backside trench segments.

8. The three-dimensional memory device of claim 7, wherein each of the connection backside trench segments laterally extends along a respective horizontal direction that is at an angle in a range from 15 degrees to 90 degrees with respect to the first horizontal direction.

9. The three-dimensional memory device of claim 7, wherein the neighboring pair of backside trenches comprises a second backside trench that includes:
   third backside trench segments that are centered around a second vertical plane extending along the first horizontal direction and are laterally spaced apart along the first horizontal direction;
   a fourth backside trench segment that is laterally offset from the second vertical plane along the second horizontal direction; and
   additional connection backside trench segment that connect the fourth backside trench segment to a respective one of the third backside trench segments.

10. The three-dimensional memory device of claim 7, wherein the neighboring pair of backside trenches comprises a second backside trench that extends along the first horizontal direction throughout an entirety thereof.

11. The three-dimensional memory device of claim 1, further comprising the dielectric material portion overlying a first alternating stack among the alternating stacks, wherein the connection via structure vertically extends through the dielectric material portion and through a vertical stack of dielectric material plates and insulating layers within the first alternating stack.

12. The three-dimensional memory device of claim 11, further comprising:
   field effect transistors overlying the substrate;
   lower-level dielectric material layers overlying the field effect transistors and underlying the alternating stacks and embedding lower-level metal interconnect structures;
   contact via structures contacting a respective electrically conductive layer within the first alternating stack; and
   upper-level metal interconnect structures overlying the dielectric material portion and contacting the contact via structures,
   wherein the connection via structure contacts a respective one of the lower-level metal interconnect structures and a respective one of the upper-level metal interconnect structures.

* * * * *